(12) United States Patent
Yamaguchi et al.

(10) Patent No.: US 12,396,166 B2
(45) Date of Patent: Aug. 19, 2025

(54) SEMICONDUCTOR DEVICE AND METHOD FOR FORMING THE WIRING STRUCTURES AVOIDING SHORT CIRCUIT THEREOF

(71) Applicant: MICRON TECHNOLOGY, INC., Boise, ID (US)

(72) Inventors: Hidenori Yamaguchi, Higashihiroshima (JP); Katsumi Koge, Higashihiroshima (JP); Junya Suzuki, Higashihiroshima (JP); Hiroshi Ichikawa, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/622,235

(22) Filed: Mar. 29, 2024

(65) Prior Publication Data

US 2024/0244836 A1 Jul. 18, 2024

Related U.S. Application Data

(62) Division of application No. 17/355,006, filed on Jun. 22, 2021, now abandoned.

(51) Int. Cl.
*H10B 12/00* (2023.01)
(52) U.S. Cl.
CPC ......... *H10B 12/50* (2023.02); *H10B 12/0335* (2023.02); *H10B 12/053* (2023.02); *H10B 12/09* (2023.02); *H10B 12/315* (2023.02); *H10B 12/34* (2023.02)

(58) Field of Classification Search
None
See application file for complete search history.

(56) References Cited

U.S. PATENT DOCUMENTS

| | | | | |
|---|---|---|---|---|
| 5,202,275 | A * | 4/1993 | Sugiura | H01L 21/76804 257/E21.585 |
| 6,329,681 | B1 | 12/2001 | Nakamura et al. | |
| 7,274,060 | B2 * | 9/2007 | Popp | H01L 21/26586 438/242 |
| 2002/0003738 | A1 * | 1/2002 | Arai | G11C 7/18 257/E21.656 |
| 2011/0104868 | A1 * | 5/2011 | Ujihara | H01L 21/32155 257/E21.24 |
| 2019/0206877 | A1 * | 7/2019 | Kim | H10B 63/30 |
| 2021/0111178 | A1 * | 4/2021 | Choi | H10B 12/31 |

* cited by examiner

*Primary Examiner* — Steven M Page
(74) *Attorney, Agent, or Firm* — Dorsey & Whitney LLP

(57) ABSTRACT

A semiconductor device includes: a substrate; a memory cell region over the substrate; a peripheral region over the substrate, the peripheral region being adjacent to the memory cell region; and a plurality of first and second word-lines extending across the memory cell region and the peripheral region; wherein the plurality of first word-lines and the plurality of second word-lines are arranged alternately with each other; and wherein the length of the first word-line in the peripheral region is longer than the length of the second word-line in the peripheral region.

20 Claims, 28 Drawing Sheets

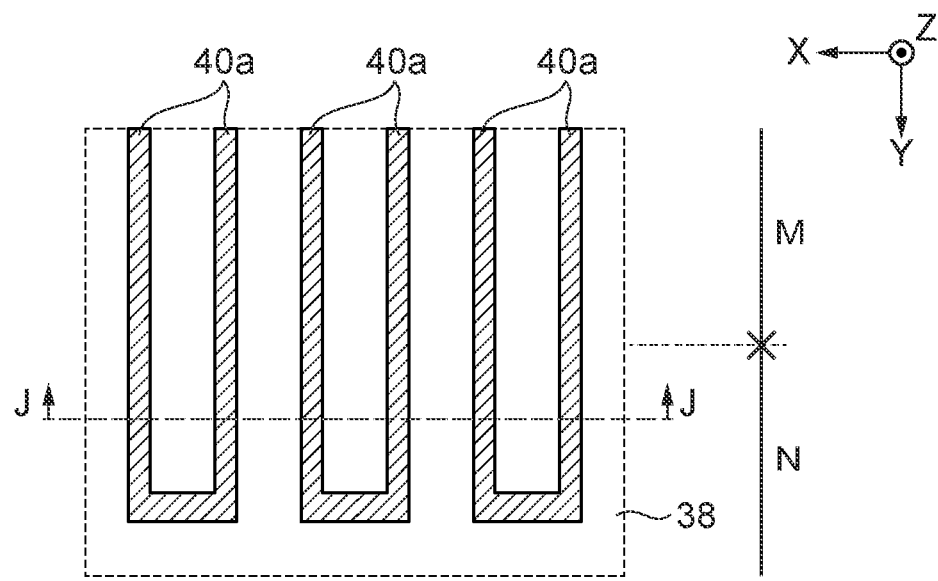
FIG.21A
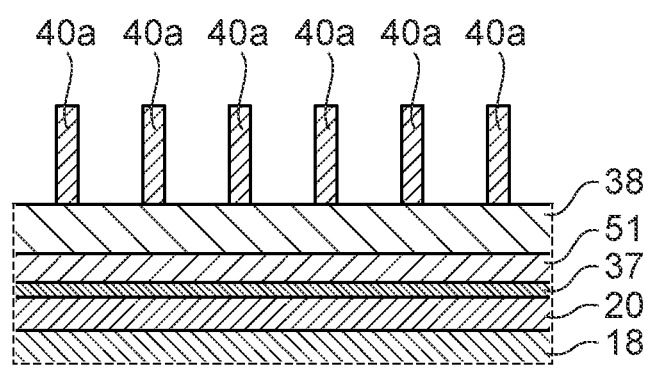
FIG.21B
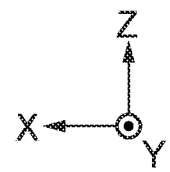

SEMICONDUCTOR DEVICE AND METHOD FOR FORMING THE WIRING STRUCTURES AVOIDING SHORT CIRCUIT THEREOF

CROSS-REFERENCE TO RELATED APPLICATIONS

This application is a divisional of U.S. patent application Ser. No. 17/355,006, filed Jun. 22, 2021, which is incorporated by reference herein in their entireties and for all purposes.

BACKGROUND

In semiconductor devices such as dynamic random access memory (hereinafter referred to as DRAM) for example, further miniaturization is being pursued in order to increase the data storage capacity. For example, the size of the repeating pitch of interconnects such as DRAM word-lines and bit-lines is being reduced, and the distance between the word-lines and between the bit-lines is being shortened. However, when forming the contact electrodes connected to the word-lines and bit-lines, if the positioning with respect to the word-lines and bit-lines is misaligned, a contact electrode that should be connected to a certain word-line may become connected to an adjacent word-line, or a contact electrode that should be connected to a certain bit-line may become connected to an adjacent bit-line.

BRIEF DESCRIPTION OF THE DRAWINGS

FIGS. 7A, 8A, 9A, 10A, 11A, 12A, 13A, and 14A are plan views illustrating an example of the schematic configuration in exemplary process stages. FIGS. 7B, 8B, 9B, 10B, 11B, 12B, 13B, and 14B are longitudinal sections illustrating the schematic configuration of the portion along the line F-F in FIGS. 7A, 8A, 9A, 10A, 11A, 12A, 13A, and 14A;

FIG. 15A is a plan view illustrating an example of the schematic configuration in an exemplary process stage. FIG. 15B is a longitudinal section illustrating the schematic configuration of a portion along the line F-F in FIG. 15A. FIG. 15C is a longitudinal section illustrating the schematic configuration of a portion along the line G-G in FIG. 15A;

FIGS. 16A and 17A are plan views illustrating an example of the schematic configuration in exemplary process stages. FIGS. 16B and 17B are longitudinal sections illustrating the schematic configuration of a portion along the line G-G in FIGS. 16A and 17A. FIGS. 16C and 17C are longitudinal sections illustrating the schematic configuration of a portion along the line H-H in FIGS. 16A and 17A;

FIGS. 18A, 18B, 19A, 19B, 20A, 20B, 21A, 21B, 22A, 22B, 23A, 23B, 24A, 24B, 25A, and 25B are diagrams illustrating a method of forming the semiconductor device according to an embodiment, and illustrate an example of the schematic configuration in exemplary process stages. FIGS. 18A, 19A, 20A, 21A, 22A, 23A, 24A, and 25A are plan views illustrating an example of the schematic configuration in exemplary process stages. FIGS. 18B, 19B, 20B, 21B, 22B, 23B, 24B, and 25B are longitudinal sections illustrating the schematic configuration of the portion along the line J-J in FIGS. 18A, 19A, 20A, 21A, 22A, 23A, 24A, and 25A;

FIGS. 26A and 27A are plan views illustrating an example of the schematic configuration in exemplary process stages. FIGS. 26B and 27B are longitudinal sections illustrating the schematic configuration of a portion along the line J-J in FIGS. 26A and 27A. FIGS. 26C and 27C are longitudinal sections illustrating the schematic configuration of a portion along the line K-K in FIGS. 26A and 27A;

DETAILED DESCRIPTION

Figure 1:
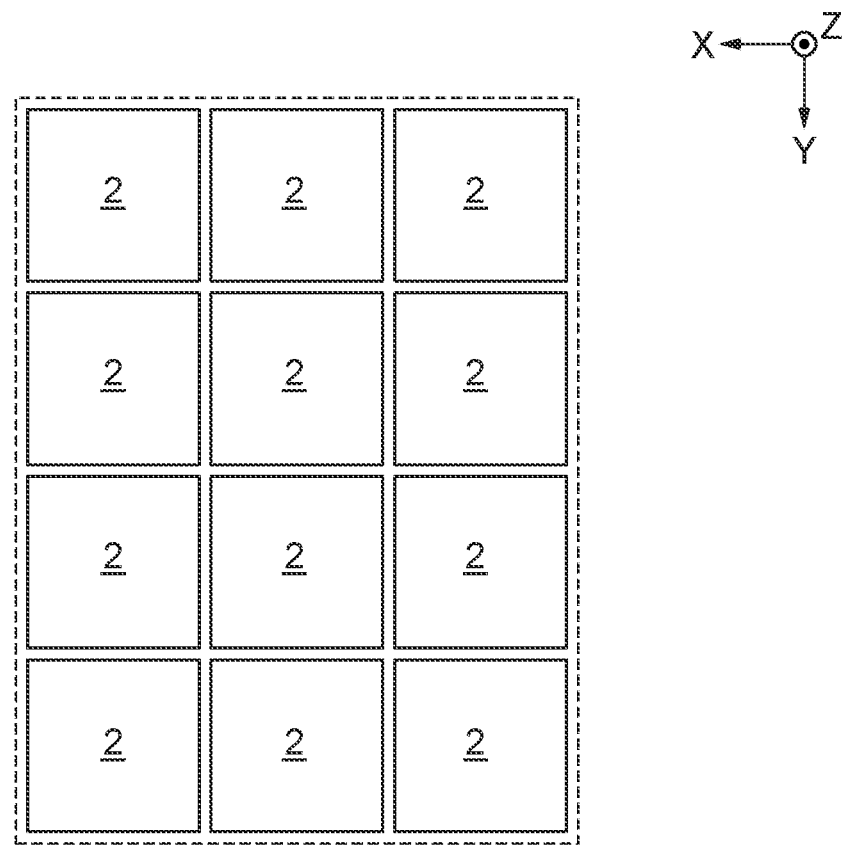
FIG. 1 is a plan view illustrating a schematic configuration of part of a memory cell region of a semiconductor device according to an embodiment.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, a semiconductor device and a method of forming the same according to an embodiment will be described with reference to FIGS. 1 to 29. The semiconductor device according to the embodiment will be described by taking DRAM as an example. In the description of the embodiment, common or related elements and elements that are substantially the same are denoted with the same signs, and the description thereof will be reduced or omitted. In the drawings referenced hereinafter, the dimensions and dimensional ratios of each unit in each of the drawings do not necessarily match the actual dimensions and dimensional ratios in the embodiment. Also, in the following description, the vertical direction means the vertical direction in the case where a semiconductor substrate 10 is on the bottom.

Figure 2:
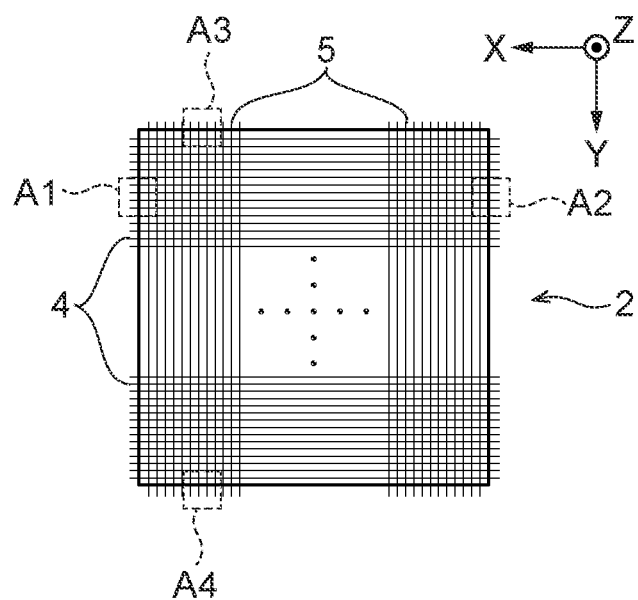
FIG. 2 is a plan view illustrating a schematic configuration of a memory mat.

FIGS. 1 and 2 are diagrams illustrating plan-view layouts of the semiconductor device according to the embodiment. As illustrated in FIG. 1, the semiconductor device is provided with a plurality of memory mats 2 disposed in a matrix on the surface of a semiconductor substrate. As illustrated in FIG. 2, in each of the memory mats 2, a plurality of word-lines 4 are disposed in parallel, extending in the X direction of the diagram. Additionally, a plurality of bit-lines 5 are disposed in the memory mats 2 in parallel, extending orthogonally to the word-lines 4, or in other words in the Y direction of the diagram. The direction parallel to the word-lines 4, or in other words the X direction, is designated the word-line direction. The direction parallel to the bit-lines 5, or in other words the Y direction, is designated the bit-line direction.

Memory mat end regions A1 and A2 are disposed in a peripheral part in the word-line direction of the memory mats 2. Each word-line 4 is connected to a row decoder not illustrated in the peripheral part. The row decoder accepts the input of a row address selected when reading/writing a memory cell from a row address buffer not illustrated. The plurality of word-lines 4 are each paired with a corresponding one of the plurality of memory cells, and control access to corresponding memory cells among the plurality of memory cells.

Memory mat end regions A3 and A4 are disposed in a peripheral part in the bit-line direction of the memory mats 2. Each bit-line 5 is connected to a column decoder not illustrated in the peripheral part. The column decoder accepts the input of a column address selected when reading/writing a memory cell from a column address buffer not illustrated. The plurality of bit-lines 5 are each paired with a corresponding one of the plurality of memory cells, and control access to corresponding memory cells among the plurality of memory cells.

Figure 3A:
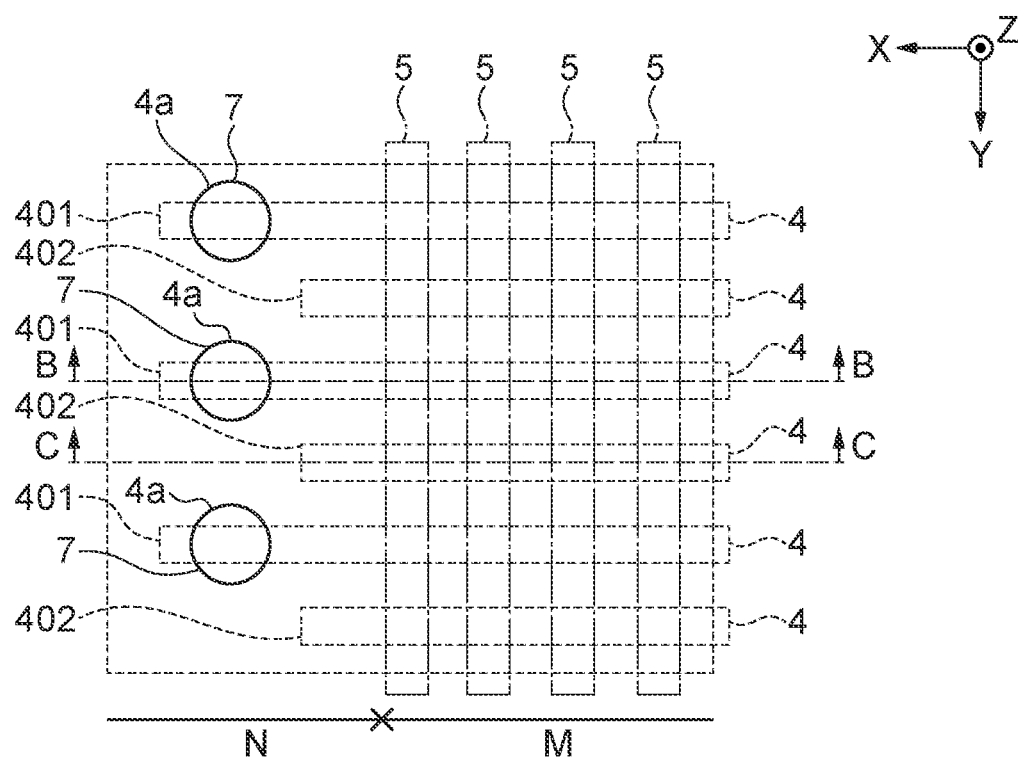
FIG. 3A is a plan-view layout illustrating a schematic configuration of the memory cell region of the semiconductor device according to an embodiment, and is an enlarged view of the memory mat end region A1 in FIG. 2.
Figure 3B:
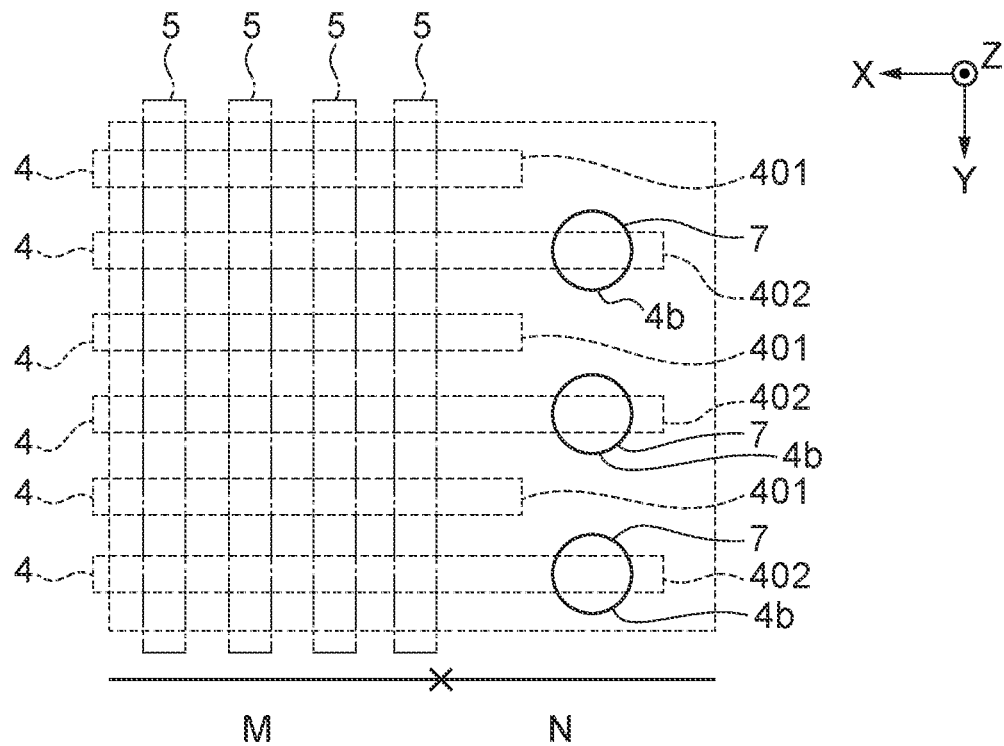
FIG. 3B is a plan-view layout illustrating a schematic configuration of the memory cell region of the semiconductor device according to an embodiment, and is an enlarged view of the memory mat end region A2 in FIG. 2.
Figure 4A:
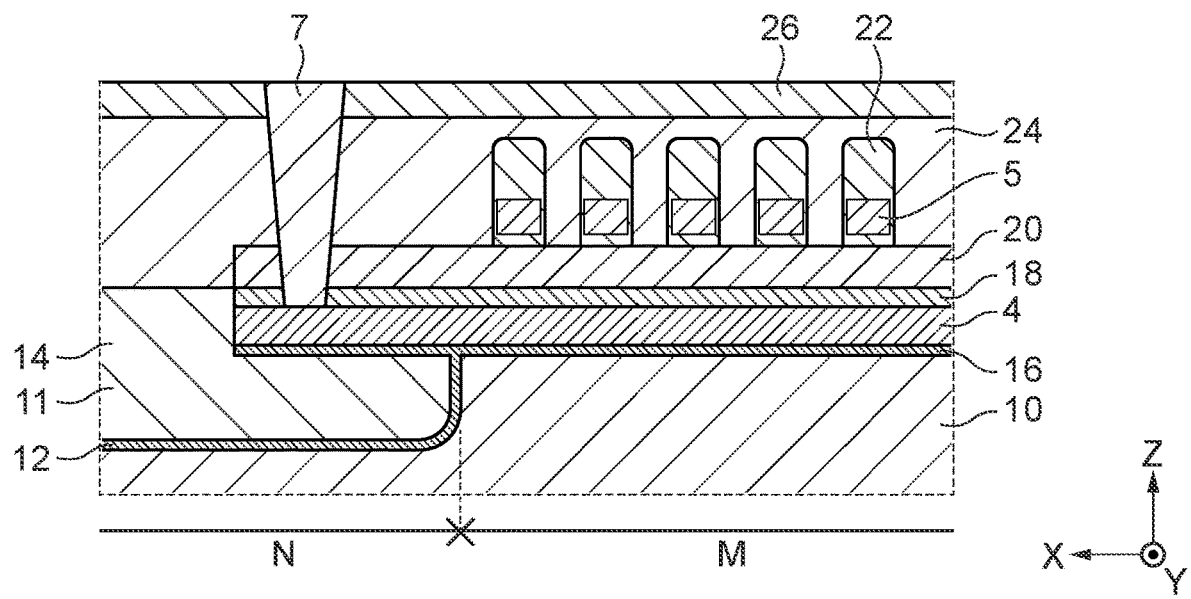
FIG. 4A is a longitudinal section illustrating a schematic configuration of the memory cell region and peripheral region of the semiconductor device according to an embodiment, and illustrates the schematic configuration of the portion along the line B-B in FIG. 3A.
Figure 4B:
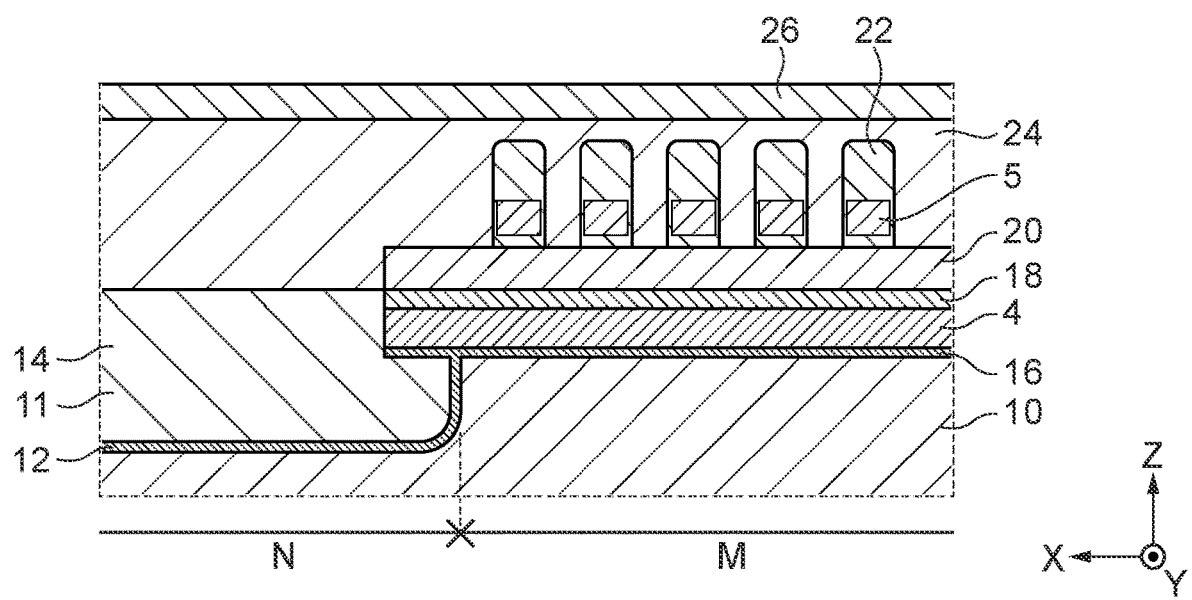
FIG. 4B is a longitudinal section illustrating a schematic configuration of the memory cell region and peripheral region of the semiconductor device according to an embodiment, and illustrates the schematic configuration of the portion along the line C-C in FIG. 3A.

FIG. 3A is an enlarged layout view of the memory mat end region A1 in FIG. 2. FIG. 3B is an enlarged layout view of the memory mat end region A2 in FIG. 2. FIG. 4A is a longitudinal section illustrating the schematic configuration along the line B-B in FIG. 3A. FIG. 4B is a longitudinal section illustrating the schematic configuration along the line C-C in FIG. 3A. The layout illustrated in FIG. 3B is symmetric with the layout illustrated in FIG. 3A, and otherwise the configuration is the same. The cross-section of the structure in FIG. 3B is a left-right reversal of the structure in FIGS. 4A and 4B.

Because the structures in FIGS. 3A and 3B, including the cross-sectional structures, are substantially the same, the description of the semiconductor device will refer to FIGS. 3A, 4A, and 4B mainly, and only refer to FIG. 3B when necessary. Similarly, the structures in FIGS. 5A and 5B, including the cross-sectional structures, are substantially the same, and therefore the description of the semiconductor device will refer to FIGS. 5A, 6A, and 6B mainly, and only refer to FIG. 5B when necessary.

As illustrated in FIG. 3A, in the memory mat end region A1, the semiconductor device is provided with a memory cell region M and a peripheral region N. In the memory cell region M, a plurality of word-lines 4 disposed at equal pitch in the Y direction are disposed orthogonally to a plurality of bit-lines 5 disposed at equal pitch in the X direction. Active regions not illustrated that form the memory cells are disposed at the intersection points between the word-lines 4 and the bit-lines 5. In the peripheral region N, peripheral circuits such as the row decoder and the row address buffer not illustrated are provided.

In FIG. 3A, the plurality of word-lines 4 are categorized into a plurality of first word-lines 401 and a plurality of second word-lines 402. The first word-lines 401 are designated the odd-numbered word-lines 401, and the second word-lines 402 are designated the even-numbered word-lines 402. Each of the first word-lines 401, that is, each of the odd-numbered word-lines 401, is disposed alternately with each of the second word-lines 402, that is, each of the even-numbered word-lines 402.

The word-lines 4 are disposed extending linearly from in the X direction from the memory cell region M and across the peripheral region N. In the peripheral region N, word-line contacts 7 are electrically connected to the first word-lines 401. In the peripheral region N, each of the second word-lines 402 not connected to the word-line contacts 7 is disposed adjacently between the first word-lines 401 connected to the word-line contacts 7. The word-line contacts 7 are connected to the first word-lines 401 in edge portions 4a of the word-lines 4. The edge portions 4a correspond to the overlapping portions between the first word-lines 401 and the word-line contacts 7. The width of the edge portion 4a of each first word-line 401 is consistent with the width of the portion of the first word-line 401 other than the edge portion 4a.

As illustrated in FIGS. 4A and 4B, the semiconductor device is provided with the word-lines 4, the bit-lines 5, and the word-line contacts 7. A semiconductor substrate 10 is partitioned into the memory cell region M and the peripheral region N. The plurality of memory cells not illustrated are provided in the memory cell region M. A peripheral isolation 11 is provided in the peripheral region N. In the peripheral isolation 11, a first insulating film 12 and a second insulating film 14 are embedded in a trench provided in the semiconductor substrate 10. A third insulating film 16 is provided below the word-lines 4, while a fourth insulating film 18 and a fifth insulating film 20 are provided above the word-lines 4.

A plurality of bit-lines 5 and a seventh insulating film 22 are provided on top of the fifth insulating film 20. An eighth insulating film 24 is provided so as to cover the tops of the second insulating film 14, the fifth insulating film 20, the bit-lines 5, and the seventh insulating film 22. The top face of the seventh insulating film 22 is further covered by a ninth insulating film 26.

In FIG. 4A, the word-line contact 7 is formed in the peripheral region N. In FIG. 4B, the word-line contact 7 is not formed in the peripheral region N. In the peripheral region N, the word-line contact 7 is provided so as to reach from the top face of the ninth insulating film 26 to the top face of the word-line 4.

The first insulating film 12, the fourth insulating film 18, the fifth insulating film 20, the seventh insulating film 22, and the ninth insulating film 26 contain silicon nitride (SiN). The second insulating film 14, the third insulating film 16, and the eighth insulating film 24 contain silicon dioxide ($SiO_2$). The word-lines 4 contain a conductive material, such as layered titanium nitride (TiN) and polysilicon (poly-Si), for example. The word-line contacts 7 contain a conductive material such as tungsten (W), for example.

As illustrated in FIGS. 3A and 4A, in the peripheral region N of the memory mat end region A1, the first word-lines 401 are longer than the second word-lines 402. The second word-lines 402 do not exist in the regions adjacent in the Y direction to the edge portions 4a. As a result, a side of each of the edge portions the first word-lines 401 is free from a second word-line 402. Consequently, when forming the word-line contacts 7 in the edge portions 4a of the first word-lines 401, connections to the second word-lines 402 adjacent to the word-line contacts 7, or in other words a short circuit, are suppressed, even if positional misalignment occurs in the lithography step.

As illustrated in FIGS. 3B and 4B, in the peripheral region N of the memory mat end region A2, the relationship between the first word-lines 401 and the second word-lines 402 is reversed. In the peripheral region N of the memory mat end region A2, the second word-lines 402 are longer than the first word-lines 401. The word-line contacts 7 are provided on the second word-lines 402. Edge portions 4b correspond to the overlapping portions between the word-line contacts 7 and the second word-lines 402. The first word-lines 401 do not exist in the regions adjacent in the Y direction to the edge portions 4b. As a result, a side of each of the edge portions the second word-lines 402 is free from a first word-line 401. Consequently, as illustrated in FIGS. 3B and 4B, when forming the word-line contacts 7 in the edge portions 4b of the second word-lines 402, connections to the first word-lines 401 adjacent to the word-line contacts 7, or in other words a short circuit, are suppressed, even if positional misalignment occurs in the lithography step. The width of the edge portion 4b of each second word-line 402 is consistent with the width of the portion of the second word-line 402 other than the edge portion 4b.

Figure 5A:
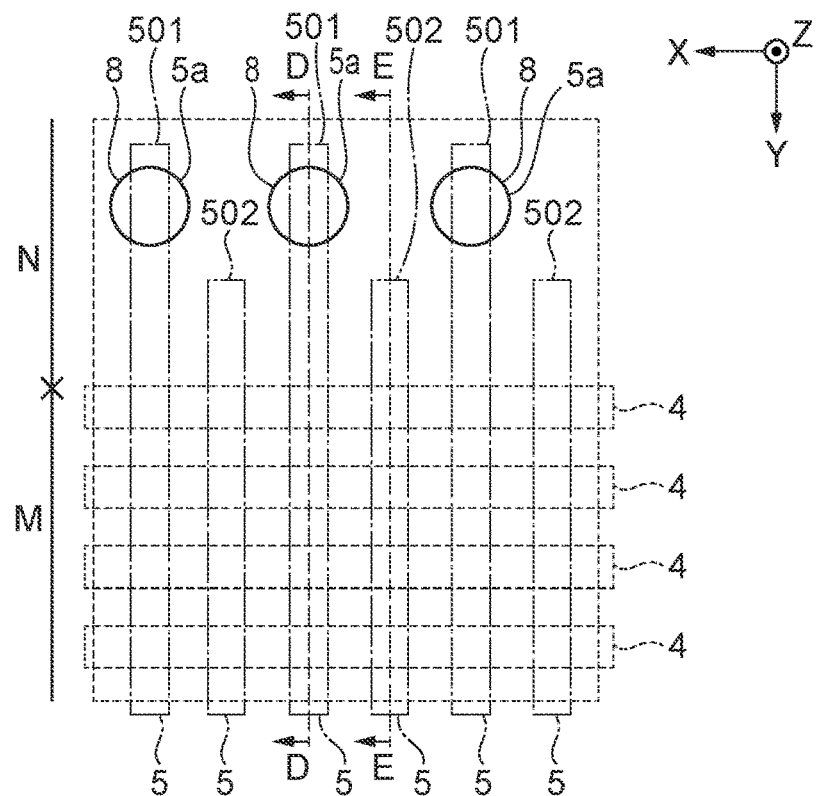
FIG. 5A is a plan-view layout illustrating a schematic configuration of the memory cell region of the semiconductor device according to an embodiment, and is an enlarged view of the memory mat end region A3 in FIG. 2.
Figure 5B:
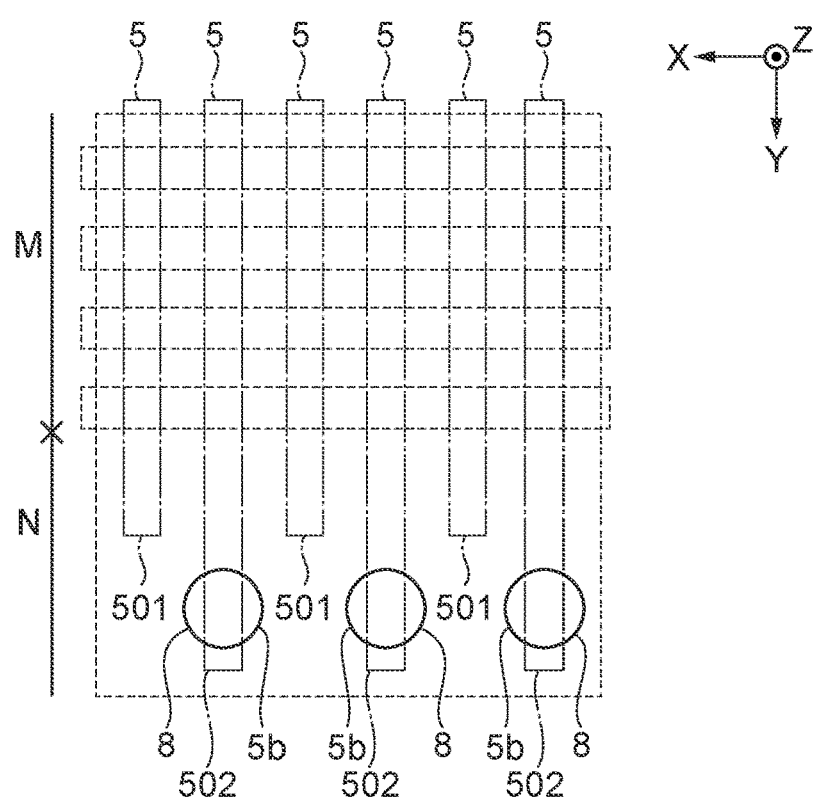
FIG. 5B is a plan-view layout illustrating a schematic configuration of the memory cell region of the semiconductor device according to an embodiment, and is an enlarged view of the memory mat end region A4 in FIG. 2.
Figure 6A:
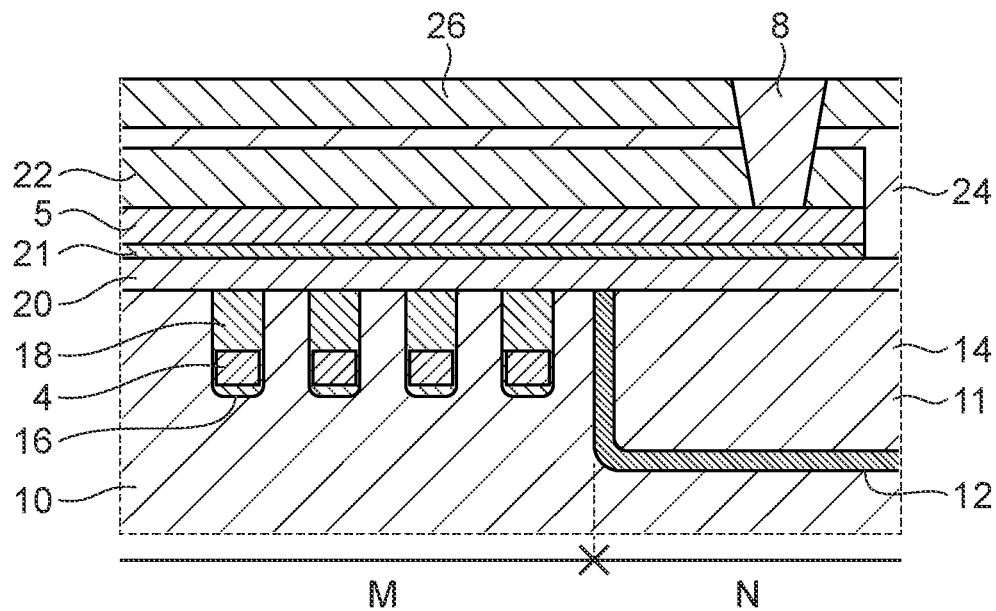
FIG. 6A is a longitudinal section illustrating a schematic configuration of the memory cell region and peripheral region of the semiconductor device according to an embodiment, and illustrates the schematic configuration of the portion along the line D-D in FIG. 5A.
Figure 6B:
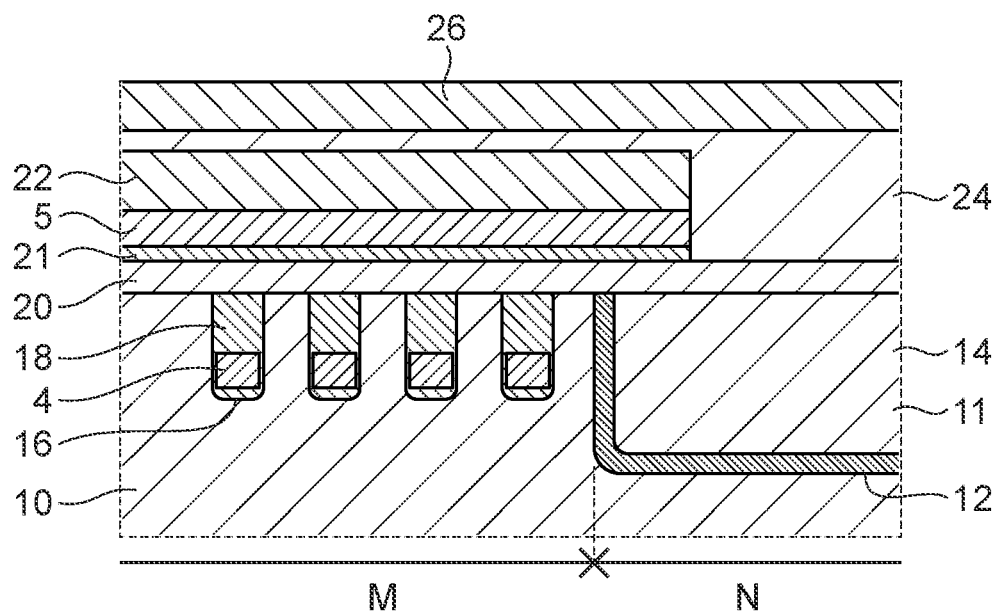
FIG. 6B is a longitudinal section illustrating a schematic configuration of the memory cell region and peripheral region of the semiconductor device according to an embodiment, and illustrates the schematic configuration of the portion along the line E-E in FIG. 5A.

FIG. 5A is an enlarged layout view of the memory mat end region A3 in FIG. 2. FIG. 5B is an enlarged layout view of the memory mat end region A4 in FIG. 2. FIG. 6A is a longitudinal section illustrating the schematic configuration along the line D-D in FIG. 5A. FIG. 6B is a longitudinal section illustrating the schematic configuration along the line E-E in FIG. 5A. The layout illustrated in FIG. 5B is symmetric with the layout illustrated in FIG. 5A, and otherwise the configuration is the same. The cross-section of the structure in FIG. 5B is a left-right reversal of the structure in FIGS. 6A and 6B. The structures in FIGS. 5A and 5B, including the cross-sectional structures, are substantially the same, and therefore the description of the semiconductor device will refer to FIGS. 5A, 6A, and 6B mainly, and only refer to FIG. 5B when necessary.

As illustrated in FIG. 5A, in the memory mat end region A3, the semiconductor device is provided with a memory cell region M and a peripheral region N. In the peripheral region N, peripheral circuits such as the column decoder and the column address buffer not illustrated are provided.

In FIG. 5A, the plurality of bit-lines 5 are categorized into first bit-lines 501 and second bit-lines 502 disposed alternately. The first bit-lines 501 are designated the odd-numbered bit-lines 501, and the second bit-lines 502 are designated the even-numbered bit-lines 502. Each of the multiple first bit-lines 501, that is, each of the odd-numbered bit-lines 501, is disposed alternately with each of the multiple second bit-lines 502, that is, each of the even-numbered bit-lines 502.

The bit-lines 5 are disposed extending linearly from in the Y direction from the memory cell region M and across the peripheral region N. In the peripheral region N, bit-line contacts 8 are electrically connected to the first bit-lines 501. In the peripheral region N, each of the second bit-lines 502 not connected to the bit-line contacts 8 is disposed adjacently between the first bit-lines 501 connected to the bit-line contacts 8. The bit-line contacts 8 are connected in edge portions 5a of the first bit-lines 501. The edge portions 5a correspond to the overlapping portions between the first bit-lines 501 and the bit-line contacts 8. The width of the edge portion 5a of each first bit-line 501 is consistent with the width of the portion of the first bit-line 501 other than the edge portion 5a.

As illustrated in FIGS. 6A and 6B, the semiconductor device is provided with the bit-lines 5 and the bit-line contacts 8. The seventh insulating film 22, the eighth insulating film 24, and the ninth insulating film 26 are provided on top of the bit-lines 5.

As illustrated in FIGS. 5A and 6A, in the peripheral region N of the memory mat end region A3, the first bit-lines 501 are longer than the second bit-lines 502. The second bit-lines 502 do not exist in the regions adjacent in the X direction to the edge portions 5a. As a result, a side of each of the edge portions the first bit-lines 501 is free from a second bit-line 502. Consequently, when forming the bit-line contacts 8 in the edge portions 5a of the first bit-lines 501, connections to the second bit-lines 502 adjacent to the bit-line contacts 8, or in other words a short circuit, are suppressed, even if positional misalignment occurs in the lithography step.

As illustrated in FIGS. 5B and 6B, in the peripheral region N of the memory mat end region A4, the relationship between the second bit-lines 502 and the first bit-lines 501 is reversed. In the peripheral region N of the memory mat end region A4, the second bit-lines 502 are longer than the first bit-lines 501. The bit-line contacts 8 are provided on the second bit-lines 502. Edge portions 5b correspond to the overlapping portions between the bit-line contacts 8 and the second bit-lines 502. The width of the edge portion 5b of each second bit-line 502 is consistent with the width of the portion of the second bit-line 502 other than the edge portion 5b.

The first bit-lines 501 do not exist in the regions adjacent in the X direction to the second bit-lines 502. As a result, a side of each of the edge portions the second bit-lines 502 is free from a first bit-line 501. Consequently, as illustrated in FIGS. 5B and 6B, when forming the bit-line contacts 8 in the edge portions 5b of the second bit-lines 502, connections to the first bit-lines 501 adjacent to the bit-line contacts 8, or in other words a short circuit, are suppressed, even if positional misalignment occurs in the lithography step.

Figure 28:
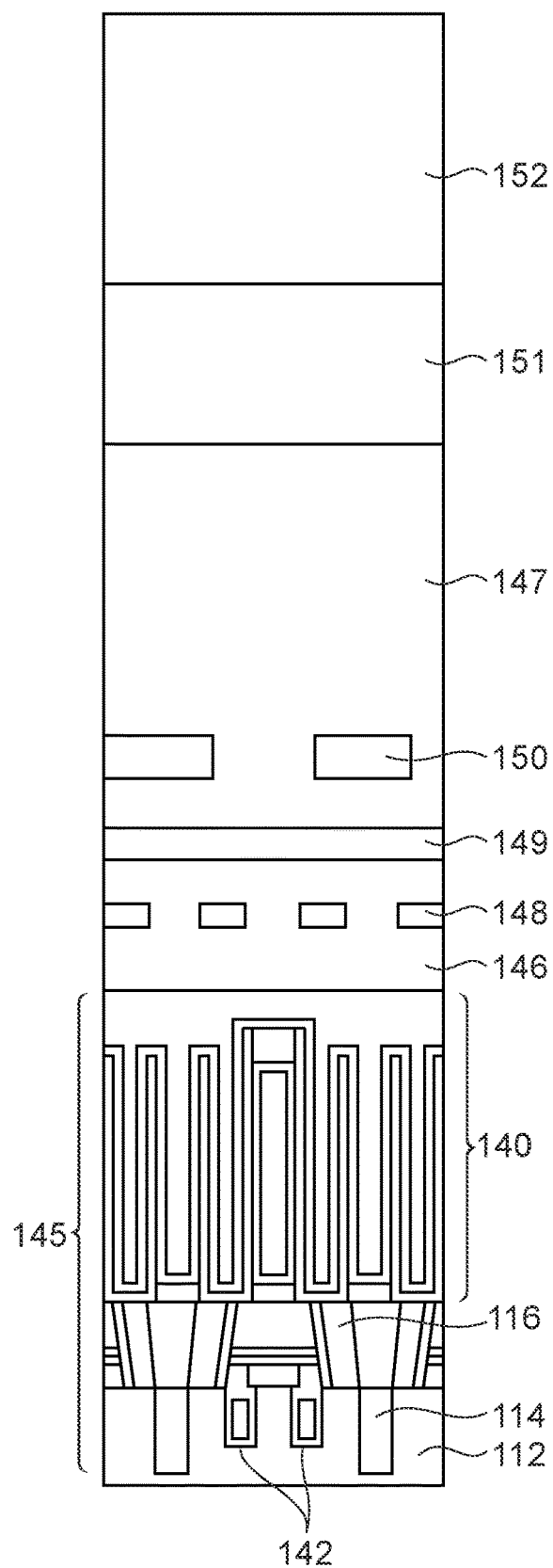
FIG. 28 is a longitudinal section illustrating one example of an overall schematic configuration of a memory cell region in a semiconductor device according to an embodiment.

FIG. 28 is a longitudinal section illustrating one example of an overall schematic configuration of a memory cell region in a semiconductor device according to an embodiment. As illustrated in FIG. 28, below a capacitor 140, components such as a semiconductor substrate 112, a shallow trench isolation 114, an access transistor 142, and a capacitor contact 116 included in a DRAM memory cell 145 are provided. The capacitor 140 is provided on the semiconductor substrate 112 in which components such as the shallow trench isolation 114, the access transistor 142, and the capacitor contact 116 are formed. The semiconductor substrate 112 corresponds to the semiconductor substrate 10 described later.

A bottom electrode of the capacitor 140 illustrated in FIG. 28 is electrically connected, through the capacitor contact 116, to one side of a source-drain region of the access transistor 142 formed in an active region of the semiconductor substrate 112. A bottom electrode of the capacitor 140 is connected to the semiconductor substrate 112. The gate electrode of the access transistor 142 corresponds to the word-lines 4 in diagrams such as FIG. 2, FIG. 3A, FIG. 3B, FIG. 4A, FIG. 4B, FIG. 5A, FIG. 5B, FIG. 6A, and FIG. 6B.

As illustrated in FIG. 28, an upper layer part that includes multilevel upper wiring layers containing components such as interconnects 148, 149, 150, and 151 is provided above the capacitor 140. The upper layer part is disposed above the memory cell 145. A top electrode of the capacitor 140 is disposed near the multilevel upper wiring layers containing components such as the interconnects 148, 149, 150, and 151. Elements 146, 147, and 152 illustrated in FIG. 28 contain an insulating material.

The capacitor 140 and the upper layer part are provided above the diagrams illustrated in FIGS. 4A, 4B, 6A, and 6B, similarly to the configuration illustrated in FIG. 28.

Figure 29:
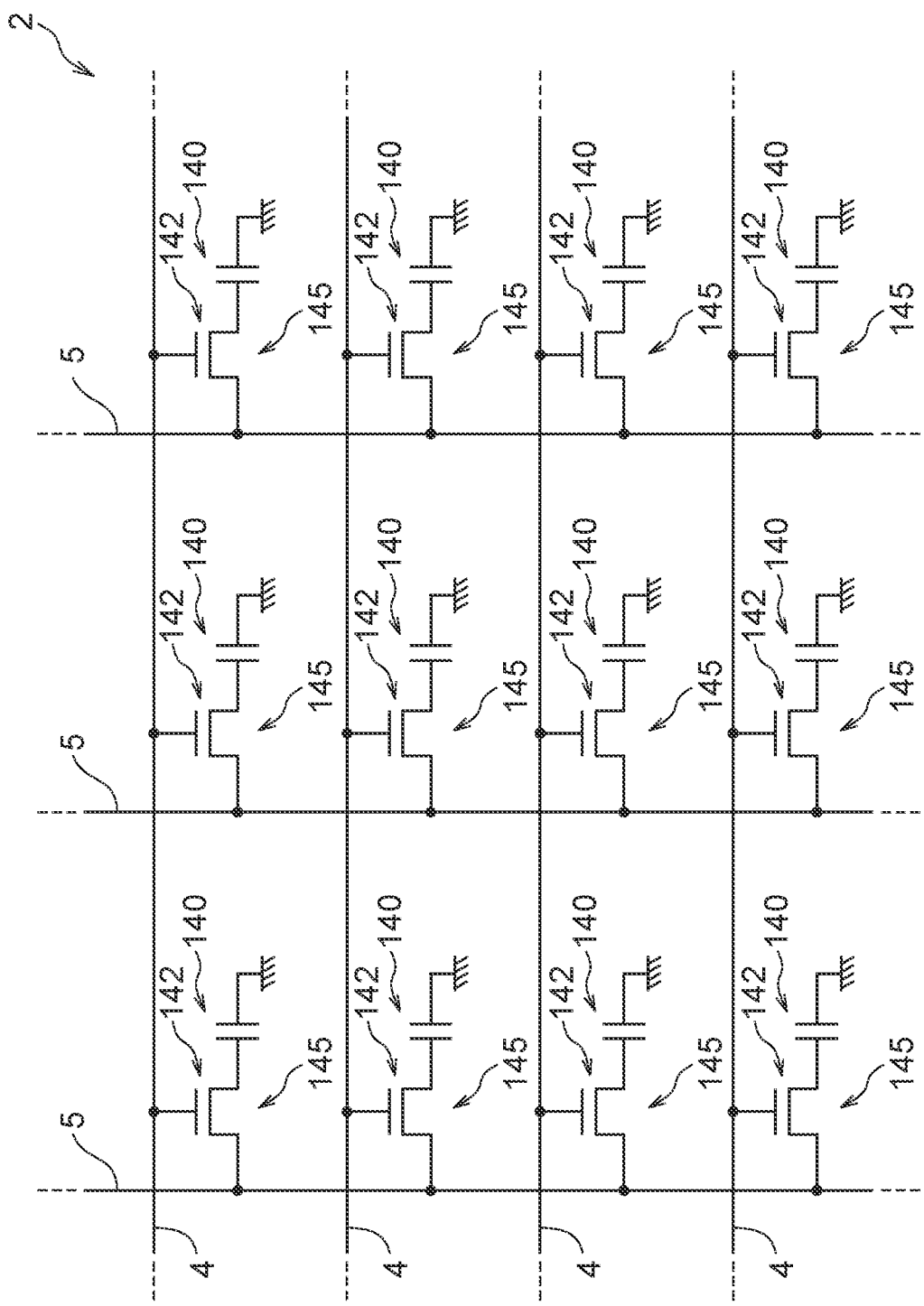
FIG. 29 is a circuit diagram illustrating a schematic configuration of an equivalent circuit of memory cells in the semiconductor device according to an embodiment.

Also, FIG. 29 illustrates an equivalent circuit of a memory cell array of the semiconductor device according to the embodiment. A plurality of memory cells 145 are arranged in a matrix, with each memory cell 145 being connected to an intersection point between the plurality of word-lines 4 and the plurality of bit-lines 5 disposed orthogonally to each other. A single memory cell 145 includes a pair of the access transistor 142 and the capacitor 140.

The access transistor 142 includes a metal-oxide-semiconductor field-effect transistor (MOSFET), for example. The gate electrode of the access transistor 142 functions as the DRAM word-line 4. The word-line 4 functions as a control line that controls the selection of the corresponding memory cell. One of the source and the drain of the access transistor 142 is connected to one of the bit-lines 5, while the other is connected to the capacitor 140. The capacitor 140 includes a capacitor and stores data by holding accumulated charge in the capacitor.

When writing data to one of the memory cells 145, a potential that turns on the access transistor 142 is applied to the word-line 4, while a low potential or a high potential corresponding to "0" or "1" of the data to write is applied to the bit-line 5. When reading out data from one of the memory cells 145, a potential that turns on the access transistor 142 is applied to the word-line 4, and a data determination is made by having a sense amplifier connected to the bit-line 5 sense the potential drawn out from the capacitor 140 to the bit-line 5.

A method of forming the semiconductor device according to the embodiment will be described with reference to the diagrams from FIGS. 3A and 3B to FIGS. 27A, 27B, and 27C. The diagrams from FIGS. 5A and 5B to FIGS. 17A, 17B, and 17C sequentially illustrate the schematic configuration of the memory mat end region A1 in FIG. 2. The diagrams from FIGS. 18A and 18B to FIGS. 27A, 27B, and 27C sequentially illustrate the schematic configuration of the memory mat end region A3 in FIG. 2.

Figure 7A:
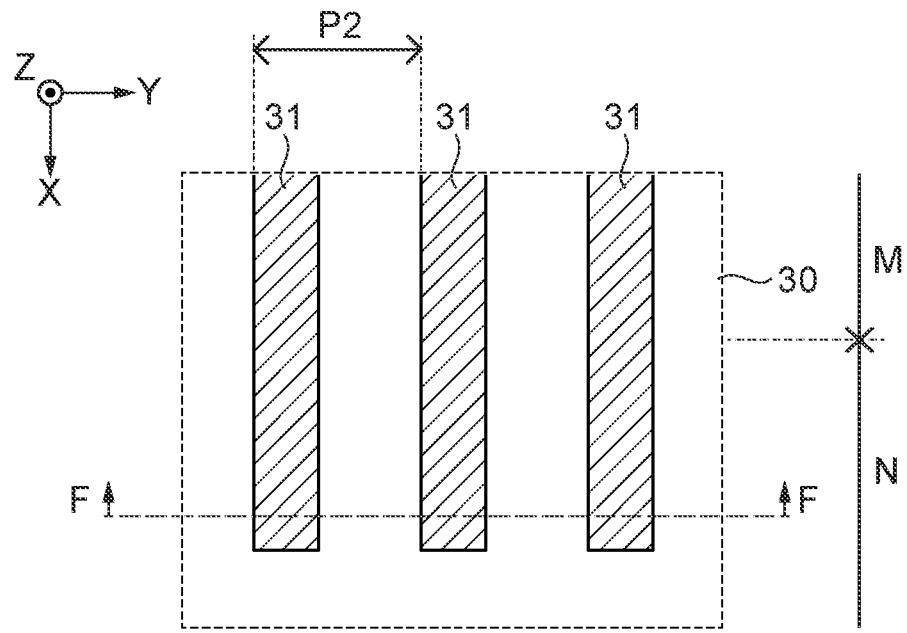
FIGS. 7A, 7B, 8A, 8B, 9A, 9B, 10A, 10B, 11A, 11B, 12A, 12B, 13A, 13B, 14A, and 14B are diagrams illustrating a method of forming the semiconductor device according to an embodiment, and illustrate an example of the schematic configuration in exemplary process stages.
Figure 7B:
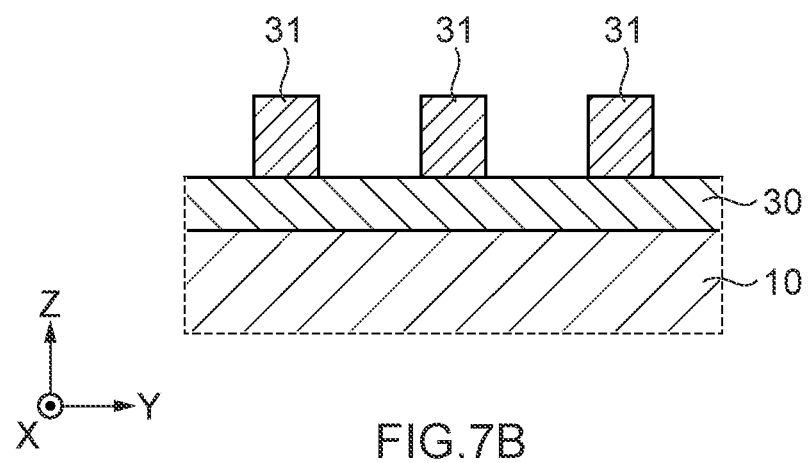

As illustrated in FIGS. 7A and 7B, a first sacrificial film 30 and a resist 31 are formed on the semiconductor substrate 10. The resist 31 is patterned in a line-and-space layout by known lithography technology.

For the semiconductor substrate 10, a monocrystalline silicon substrate can be used, for example. The first sacrificial film 30 contains an insulating material such as silicon dioxide ($SiO_2$), for example. The first sacrificial film 30 is formed by chemical vapor deposition (hereinafter referred to as "CVD"), for example. The dimension in the Y direction of the resist 31 is approximately triple the dimension in the Y direction of the word-lines 4 illustrated in FIG. 17A. A repeating pitch P2 of the resist 31 is quadruple a repeating pitch P1 of the word-lines 4 illustrated in FIG. 17A.

Figure 8A:
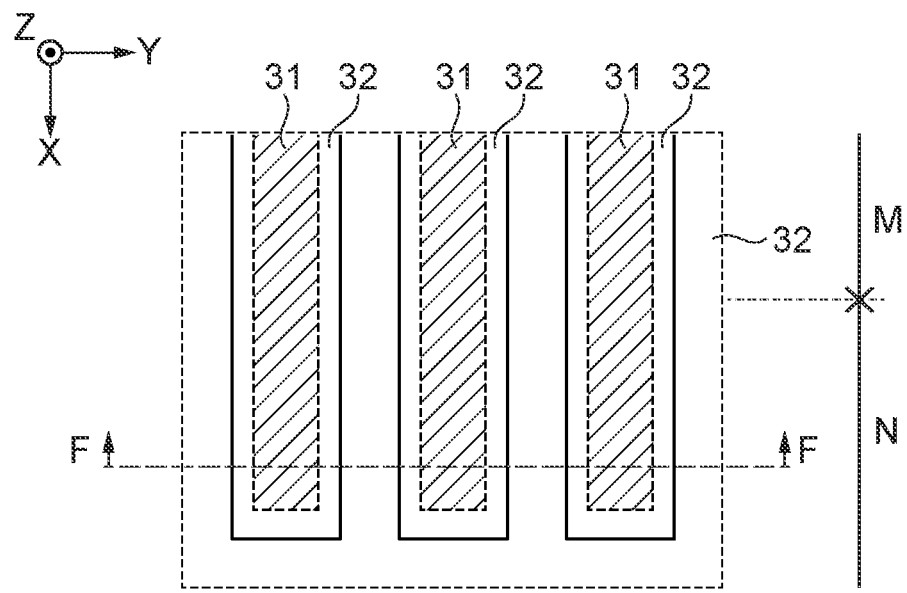
Figure 8B:
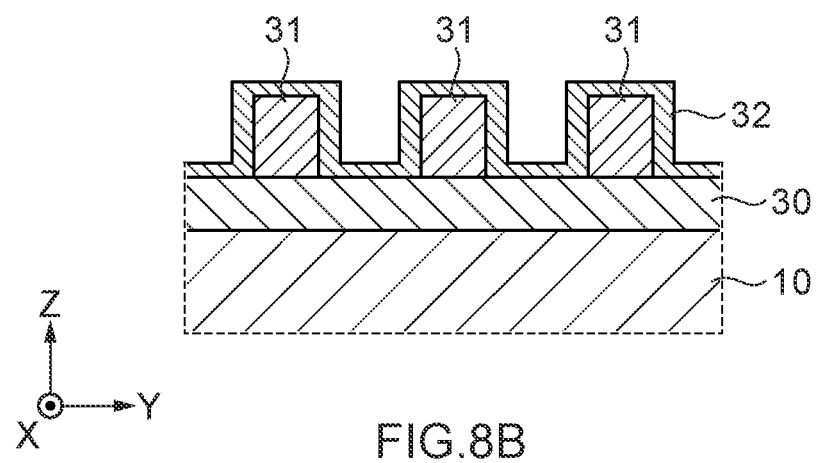

Next, as illustrated in FIGS. 8A and 8B, a second sacrificial film 32 is formed so as to cover the first sacrificial film 30 and the resist 31. The second sacrificial film 32 contains an insulating material such as silicon nitride (SiN), for example. The second sacrificial film 32 is formed using low-temperature CVD, for example, and is deposited under approximately room-temperature conditions, for example. The thickness of the second sacrificial film 32 is set to be substantially the same thickness as the width dimension of each word-line 4 described later.

Figure 9A:
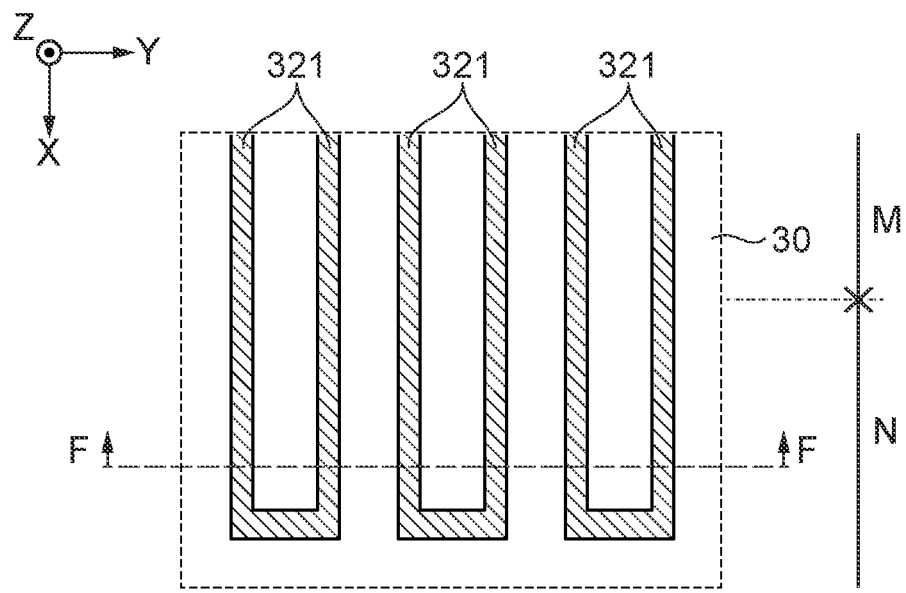
Figure 9B:
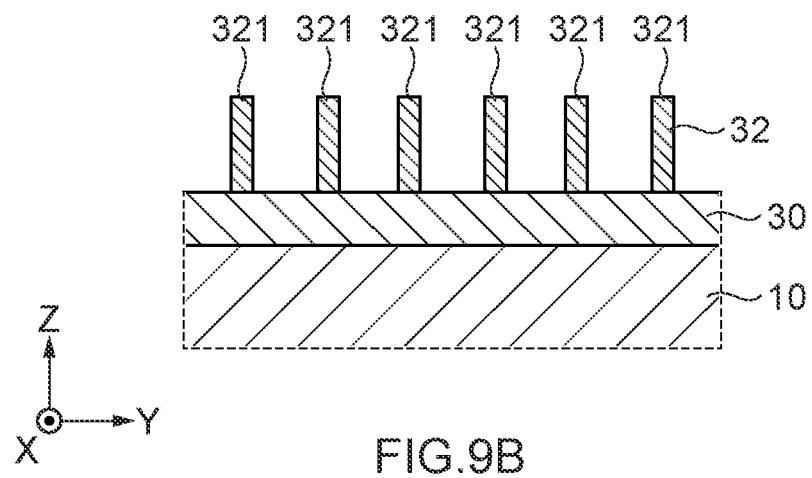

Next, as illustrated in FIGS. 9A and 9B, the second sacrificial film 32 is etched back by performing anisotropic dry etching on the semiconductor substrate 10 on which the second sacrificial film 32 is deposited, and pillars 321 are formed by leaving the second sacrificial film 32 on the side walls of the resist 31. The surface of the first sacrificial film 30 is exposed by the etchback. The pillars 321 are formed wrapping around the resist 31. Consequently, the ends of the pillars 321 are U-shaped. Thereafter, the resist 31 is removed. The Y-direction dimension of the pillars 321 is prescribed by the thickness of the second sacrificial film 32. As illustrated in FIG. 9B, in a sectional view along the line F-F in FIG. 9A, the pillars 321 are arranged in a line-and-space layout.

Figure 10A:
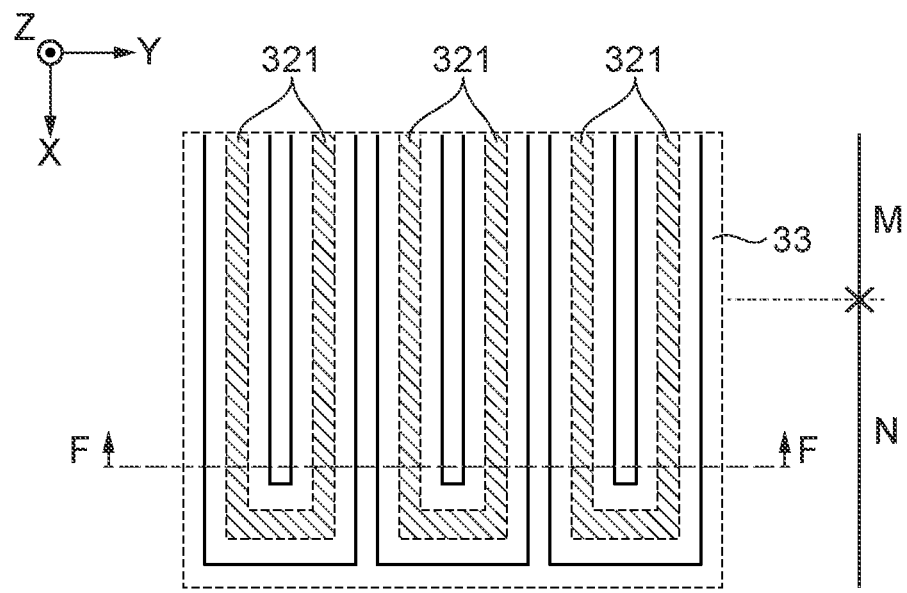
Figure 10B:
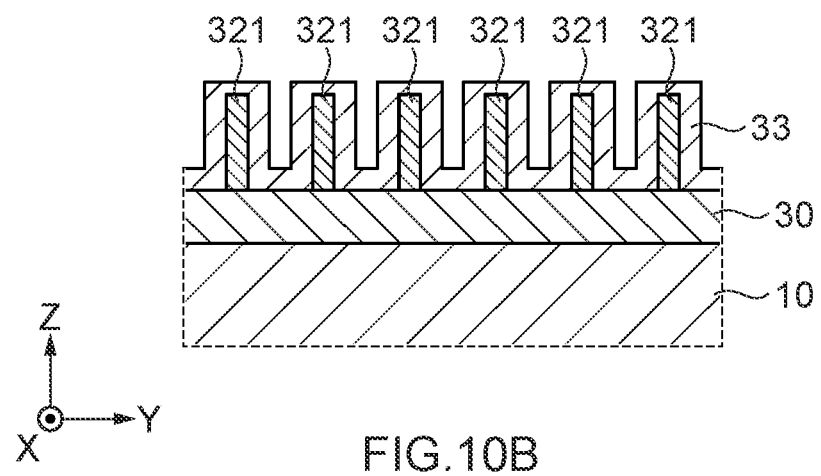

Next, as illustrated in FIGS. 10A and 10B, a third sacrificial film 33 is formed so as to cover the first sacrificial film 30 and the pillars 321. The third sacrificial film 33 contains an insulating material. The third sacrificial film 33 contains silicon nitride, for example. The third sacrificial film 33 is formed by CVD, for example. The thickness of the third sacrificial film 33 is set to be substantially the same thickness as the width dimension of each word-line 4 described later.

Figure 11A:
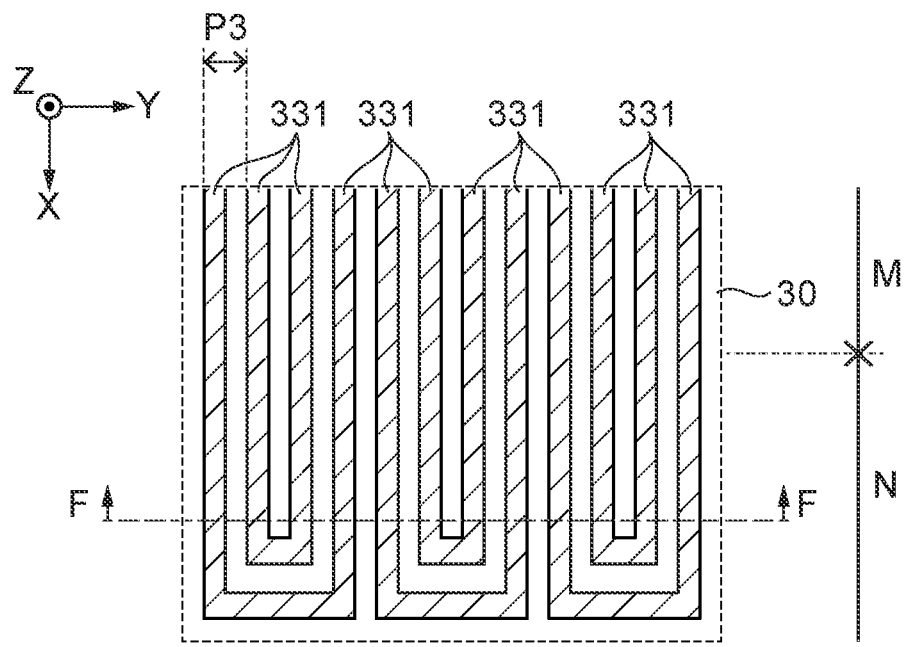
Figure 11B:
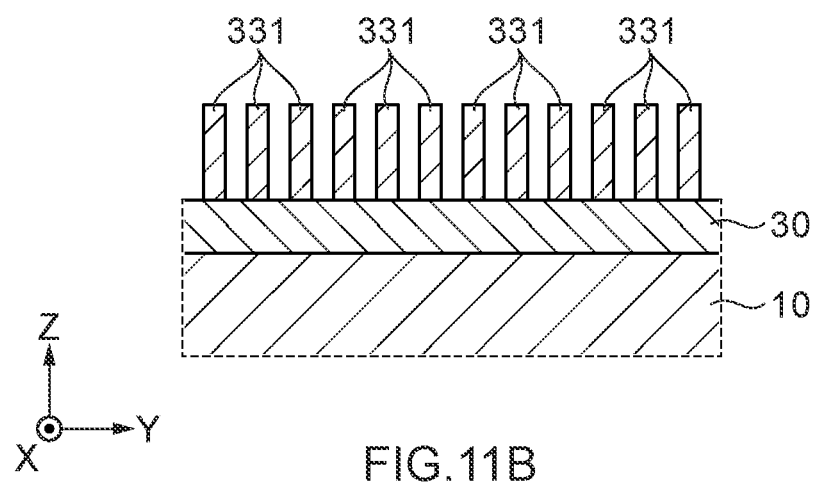

Next, as illustrated in FIGS. 11A and 11B, the third sacrificial film 33 is etched back by performing anisotropic dry etching on the semiconductor substrate 10 on which the third sacrificial film 33 is deposited, and pillars 331 are formed by leaving the third sacrificial film 33 on the side walls of the pillars 321. The surface of the first sacrificial film 30 is exposed by the etchback. The pillars 331 are formed wrapping around the pillars 321. Consequently, the ends of the pillars 331 are U-shaped. Thereafter, the pillars 321 are removed by performing dry etching under conditions by which the pillars 321 can be selectively removed.

The Y-direction dimension of the pillars 331 is prescribed by the thickness of the third sacrificial film 33. As illustrated in FIG. 11B, in a sectional view along the line F-F in FIG.

11A, the pillars 331 are arranged in a line-and-space layout with a repeating pitch P3. The repeating pitch P3 of the pillars 331 is substantially the same as the repeating pitch P1 of the word-lines 4 illustrated in FIG. 17A.

Figure 12A:
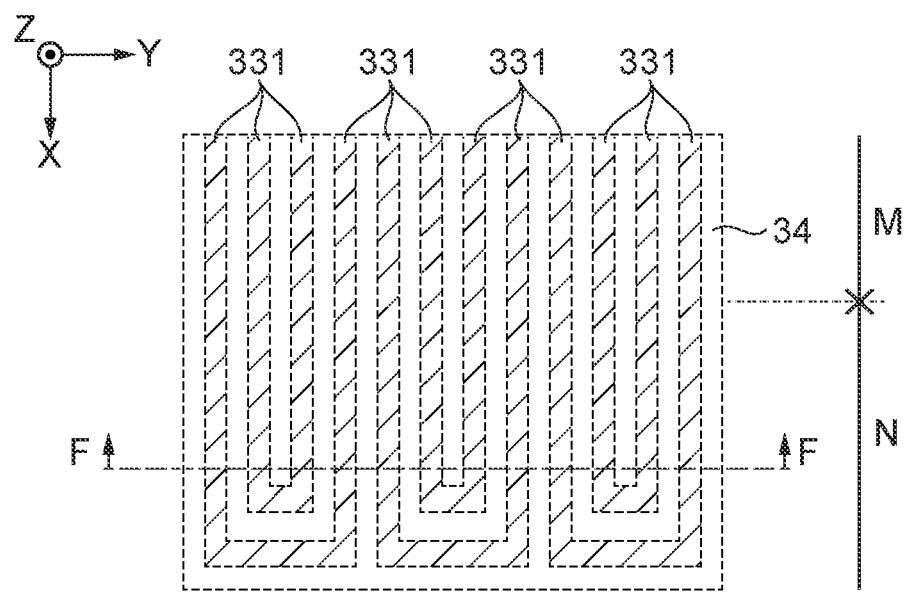
Figure 12B:
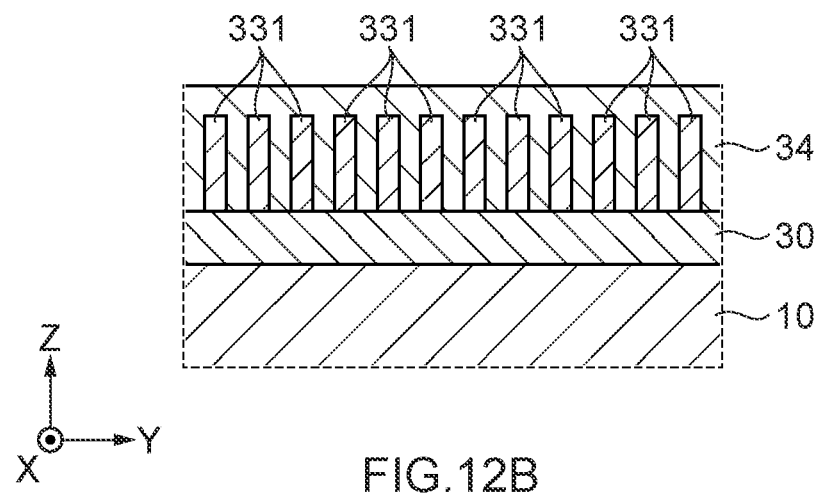

Next, as illustrated in FIGS. 12A and 12B, a fourth sacrificial film 34 is formed so as to cover the first sacrificial film 30 and the pillars 331, and also be embedded between the plurality of pillars 331. The fourth sacrificial film 34 contains an insulating material such as silicon nitride, for example. The fourth sacrificial film 34 is formed by CVD, for example.

Figure 13A:
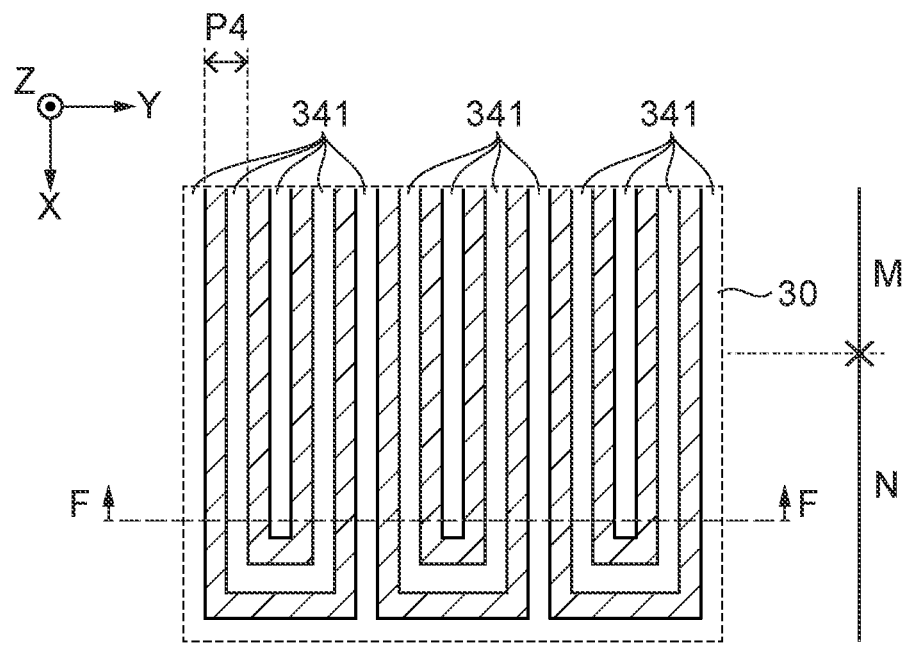
Figure 13B:
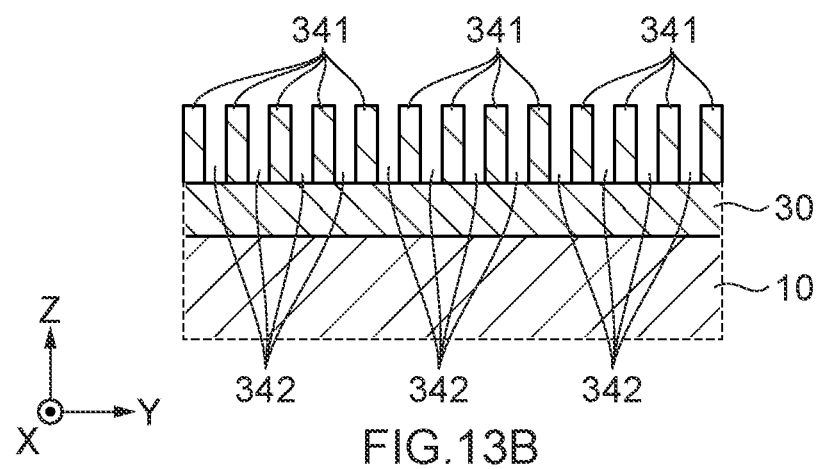

Next, as illustrated in FIGS. 13A and 13B, the fourth sacrificial film 34 is etched until the top faces of the pillars 331 are exposed, and then the pillars 331 are removed by performing dry etching under conditions by which the pillars 331 can be selectively removed. The structures that remain after this step are pillars 341. The pillars 341 have the inverse pattern of the pillars 331. The respective regions where the plurality of pillars 331 are removed become gaps 342 between the plurality of pillars 341. The gaps 342 form an opening pattern. In the sectional view along the line F-F in FIG. 13A, the pillars 341 are arranged in a line-and-space layout. The repeating pitch P4 of the gaps 342 between the pillars 341 is substantially the same as the repeating pitch P1 of the word-lines 4 illustrated in FIG. 17A.

Figure 14A:
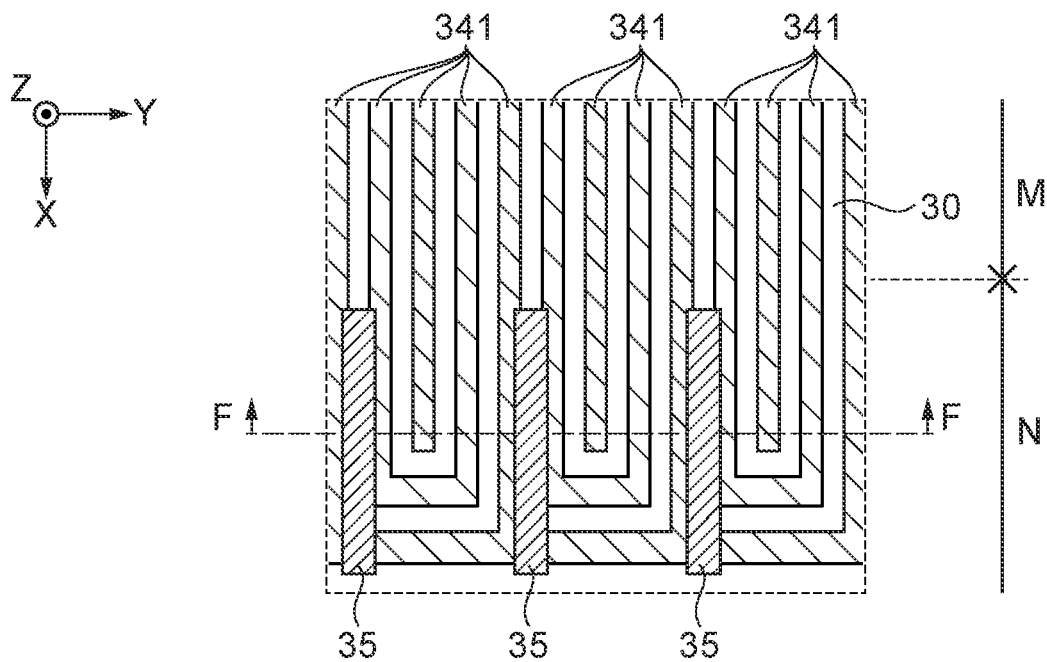
Figure 14B:
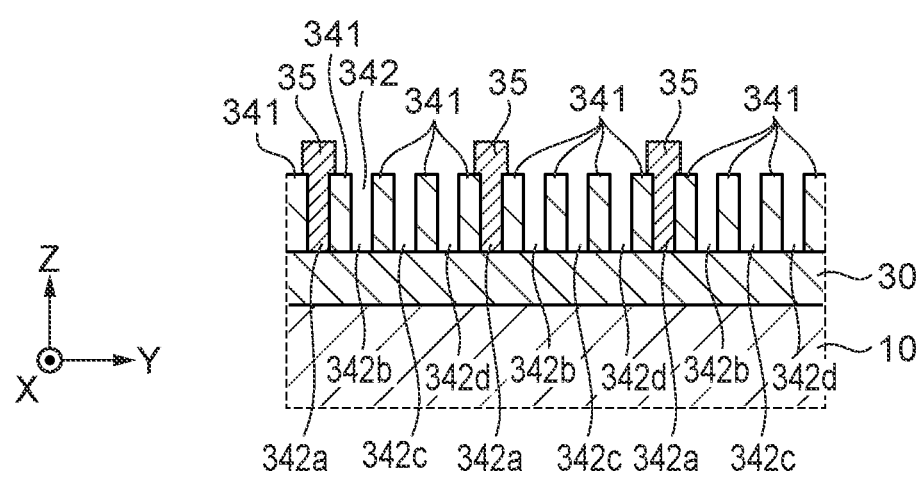

Next, as illustrated in FIGS. 14A and 14B, a resist 35 is formed so as to fill some of the plurality of gaps 342 in the peripheral region N while leaving three unfilled gaps 342 in between in the Y direction. FIG. 14B is a longitudinal section illustrating the portion along the line F-F in FIG. 14A. The resist 35 is patterned by known lithography technology. The resist 35 is formed so as to fill the gaps 342 partially along the gaps 342 extending in the X direction. As illustrated in FIG. 14B, the gaps 342 are arranged in a repeating pattern of four gaps from a first gap 342a to a fourth gap 342d. The pattern of the four gaps 342 forms four line-shaped mask patterns extending linearly in the X direction. As a result, a repetition of four line-shaped mask patterns is formed. The resist 35 is disposed in a portion on top of the first gap 342a. Next, the resist 35 is cured by irradiation with ultraviolet light or by a baking process, for example.

Figure 15A:
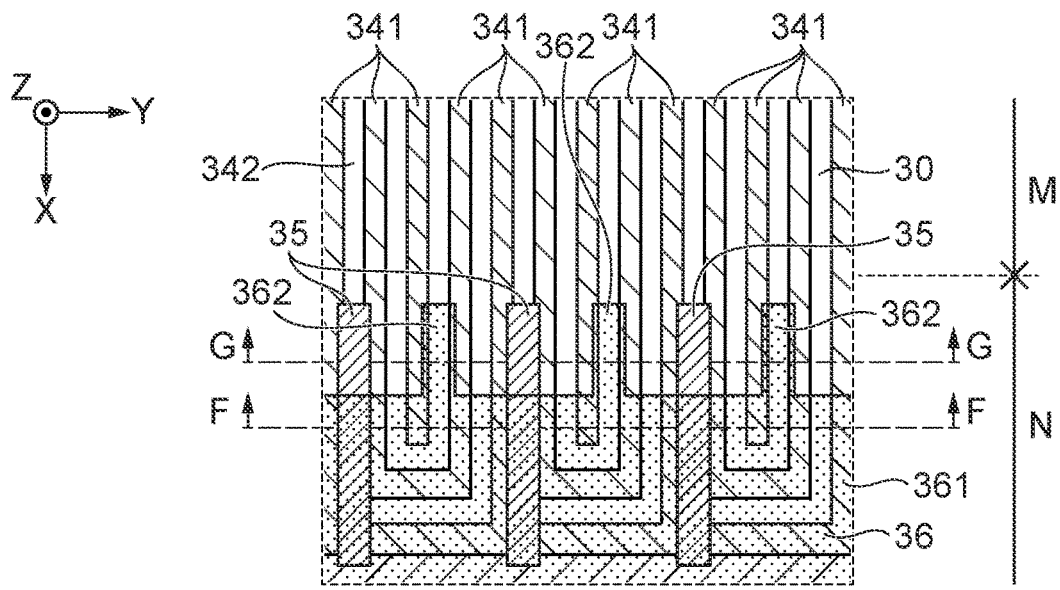
FIGS. 15A, 15B, and 15C are diagrams illustrating a method of forming the semiconductor device according to an embodiment, and illustrate an example of the schematic configuration in an exemplary process stage.
Figure 15B:
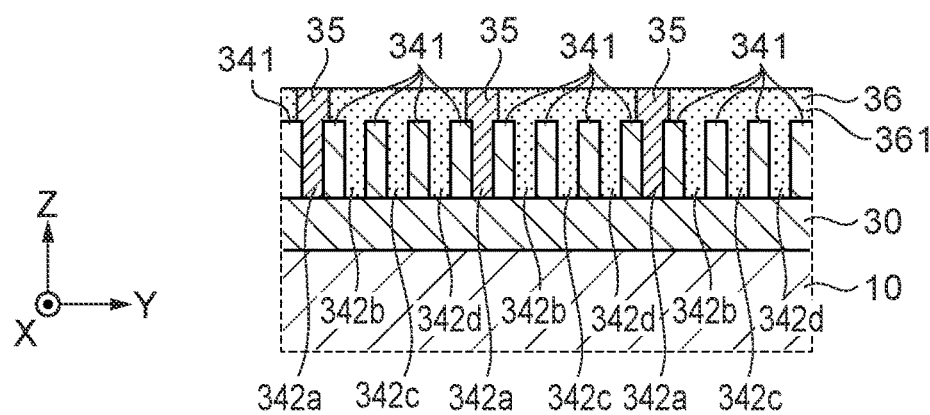
Figure 15C:
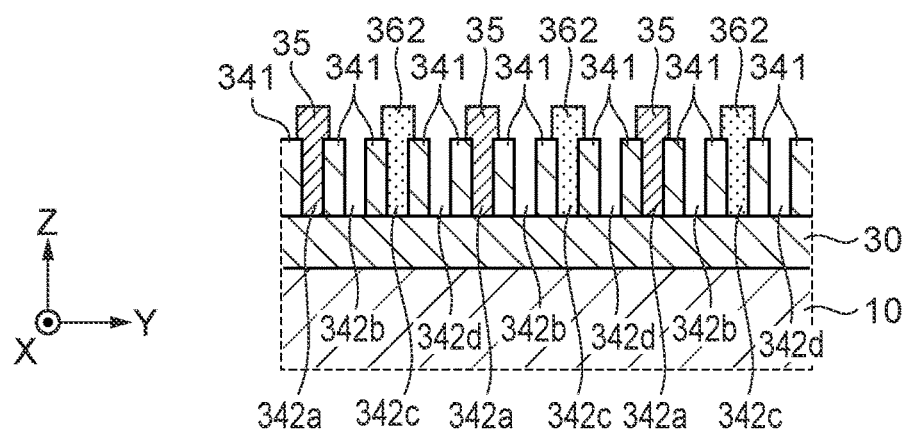

Next, as illustrated in FIGS. 15A, 15B, and 15C, a resist 36 is formed in the peripheral region N. The resist 36 is patterned by known lithography technology. The resist 36 is formed partially overlapping the resist 35. Because the resist 35 has been cured, the resist 35 still remains after the formation of the resist 36.

The resist 36 has a staggered or uneven shape. The resist 36 is provided with a rectangular part 361 and projecting parts 362. The rectangular part 361 is disposed to cover the U-shaped parts of the pillars 341. The projecting parts 362 are arranged in parallel in the Y direction, centered between the adjacent resists 35. The projecting parts 362 are arranged to have at least one gap 342 between each projecting part 362 and the resist 35. In the case where the resist 35 is disposed in the first gap 342a, the projecting parts 362 are disposed in the third gap 342c. Neither the resist 35 nor the projecting parts 362 are provided in the second gap 342b and the fourth gap 342d. Through the above steps, in the peripheral region N, the resist 35 and the resist 36 are formed in a staggered arrangement configured to cover the U-shaped parts of the pillars 341. The resist 35 and the resist 36 are arranged to have one gap 342 in between.

Figure 16A:
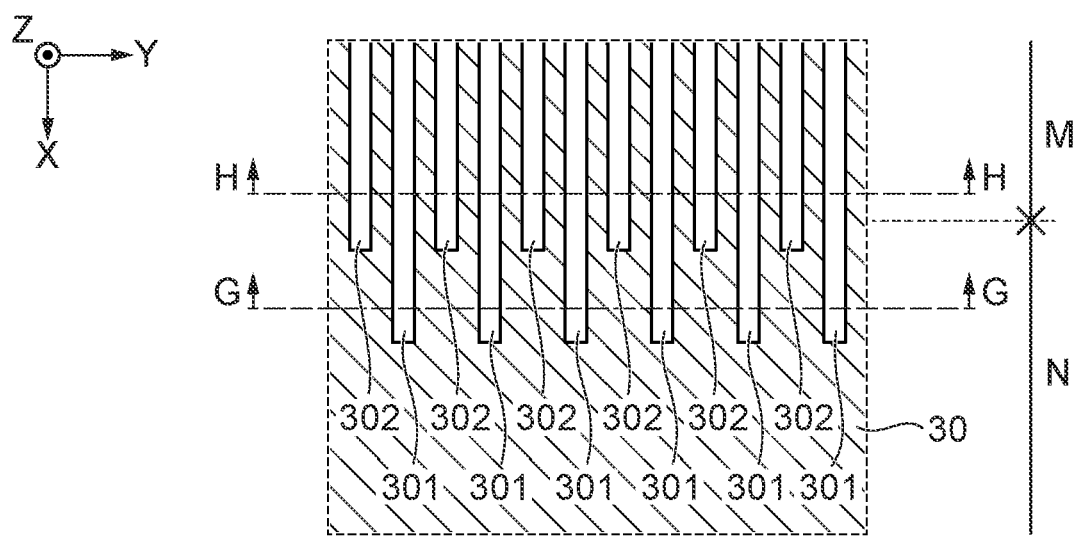
FIGS. 16A, 16B, 16C, 17A, 17B, and 17C are diagrams illustrating a method of forming the semiconductor device according to an embodiment, and illustrate an example of the schematic configuration in exemplary process stages.
Figure 16B:
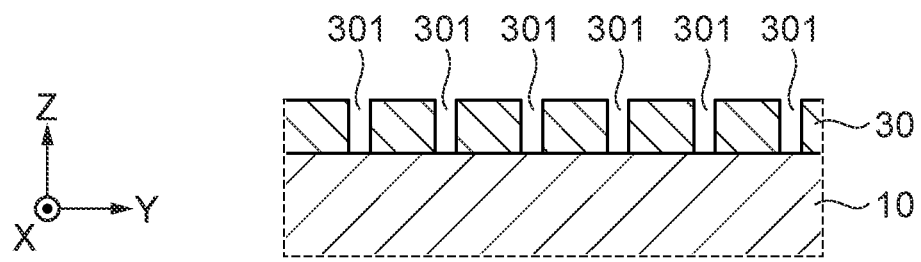
Figure 16C:
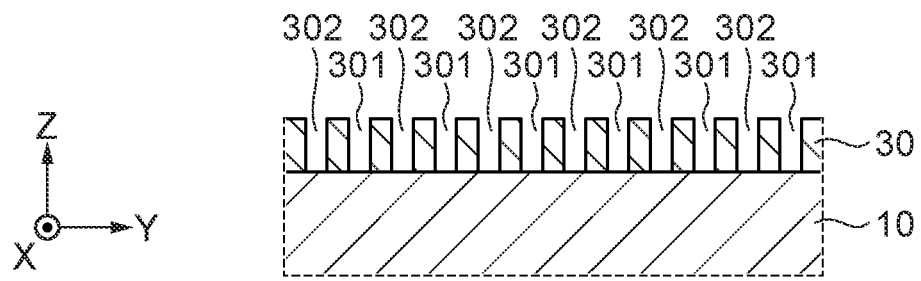

Next, as illustrated in FIGS. 16A, 16B, and 16C, anisotropic dry etching is performed on the first sacrificial film 30 using the pillars 341, the resist 35, and the resist 36 as an etching mask. The anisotropic dry etching is performed under conditions by which the etch rate of the first sacrificial film 30 is high and the etch rate of the semiconductor substrate 10 is sufficiently low. Through the anisotropic dry etching of the first sacrificial film 30, openings 301 and 302 are formed in the first sacrificial film 30. The top face of the semiconductor substrate 10 is exposed in the openings 301 and 302. Thereafter, the pillars 341, the resist 35, and the resist 36 are removed. Through the above steps, long openings 301 and short openings 302 are formed alternately in the first sacrificial film 30 in the peripheral region N.

Figure 17A:
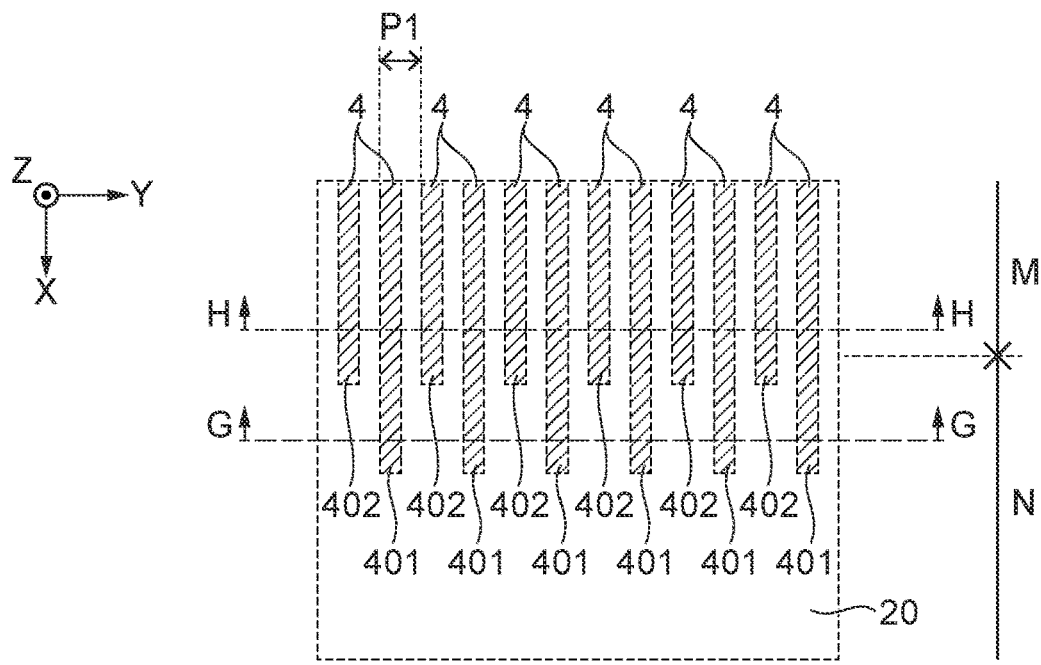
Figure 17B:
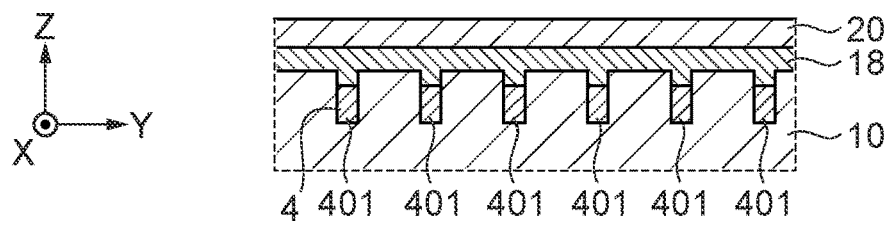
Figure 17C:
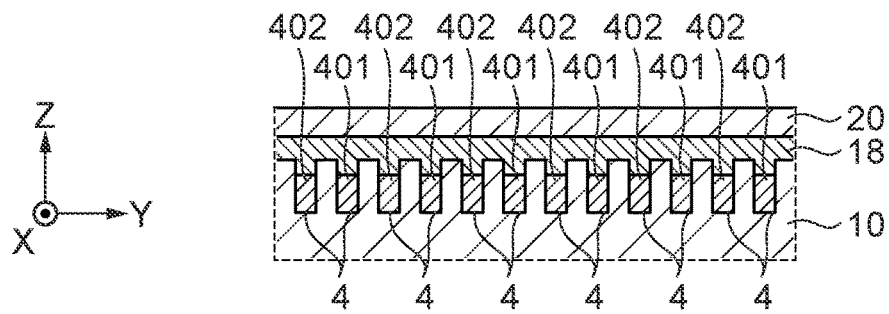

Next, as illustrated in FIGS. 17A, 17B, and 17C, anisotropic dry etching is performed on the semiconductor substrate 10 using the first sacrificial film 30 having the openings 301 and 302 formed therein as an etching mask. The anisotropic dry etching is performed under conditions by which the etch rate of the semiconductor substrate 10 is high and the etch rate of the first sacrificial film 30 is sufficiently low. Through the anisotropic dry etching of the semiconductor substrate 10, trenches obtained by the transfer of the openings 301 and 302 are formed in the semiconductor substrate 10. The depth of the trenches is adjusted by controlling the duration of the anisotropic dry etching.

Thereafter, the first sacrificial film 30 is removed. The first sacrificial film 30 is removed by dry etching or by using buffered hydrofluoric acid, for example. The word-lines 4 are formed by embedding a conductive material in a lower part of the trenches. The word-lines 4 contain layered titanium nitride (TiN) and polysilicon (poly-Si), for example. The titanium nitride and polysilicon are formed by CVD, for example.

The fourth insulating film 18 and the fifth insulating film 20 are formed so as to cover the upper part of the trenches and the top face of the semiconductor substrate 10. The fourth insulating film 18 and the fifth insulating film 20 contain an insulating material such as silicon nitride, for example. The fourth insulating film 18 and the fifth insulating film 20 are deposited by CVD, for example. Through the above steps, the long first word-lines 401 and the short second word-lines 402 are formed alternately in the peripheral region N.

The word-lines 4 are formed by treating the resist 31 in FIGS. 7A and 7B as a prototype and performing a doubling process twice with respect to the formation of the pillars 321 in FIGS. 9A and 9B and the formation of the pillars 331 in FIGS. 11A and 11B. In other words, the word-lines 4 are formed using quad-patterning technology. With this arrangement, the repeating pitch P1 of the word-lines 4 illustrated in FIG. 17A is one-fourth the repeating pitch P2 of the resist 31 illustrated in FIG. 7A.

Figure 18A:
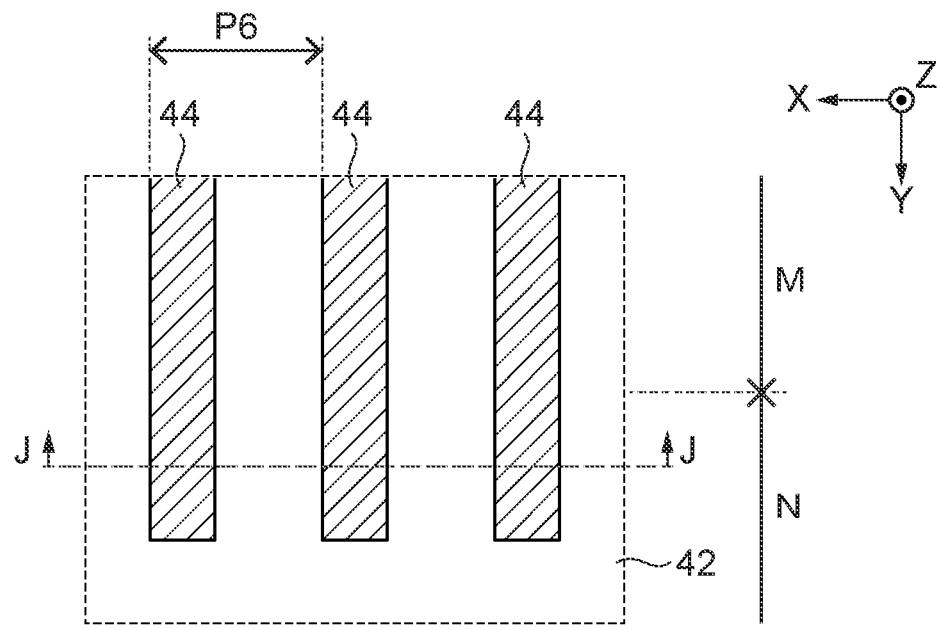
Figure 18B:
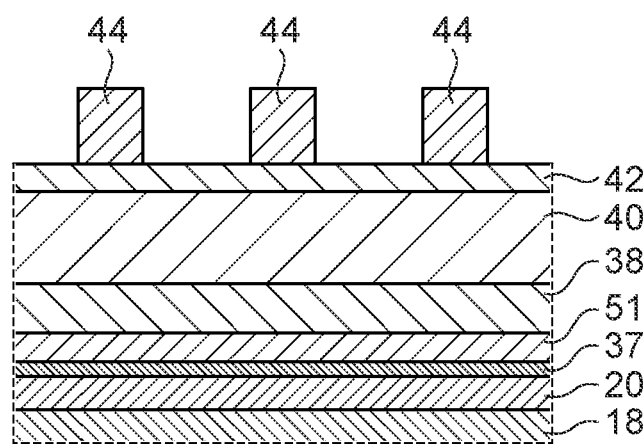

Next, as illustrated in FIGS. 18A and 18B, a multilayer film containing a 10th insulating film 37, a conductive film 51, an 11th insulating film 38, a fifth sacrificial film 40, and a sixth sacrificial film 42 is formed on top of the fourth insulating film 18 and the fifth insulating film 20. In FIGS. 18A, 18B, and the diagrams thereafter, the configuration below the fourth insulating film 18, or in other words the configuration in the semiconductor substrate 10, is omitted from illustration.

The 10th insulating film 37, the 11th insulating film 38, the fifth sacrificial film 40, and the sixth sacrificial film 42 all contain an insulating material. The 10th insulating film 37 and the 11th insulating film 38 contain silicon nitride for example. The fifth sacrificial film 40 contains carbon for example. The sixth sacrificial film 42 contains silicon oxynitride (SiON) for example. The conductive film 51 contains a metal such as tungsten, for example. The 10th insulating film 37, the conductive film 51, the 11th insulating film 38, the fifth sacrificial film 40, and the sixth sacrificial film 42 are formed by CVD, for example.

A resist 44 is formed on top of the sixth sacrificial film 42. The resist 44 is patterned in a line-and-space layout by known lithography technology. The dimension in the X direction of the resist 44 is approximately triple the dimension in the X direction of the bit-lines 5 illustrated in FIG. 27A. A repeating pitch P6 of the resist 44 is quadruple a repeating pitch P5 of the bit-lines 5 illustrated in FIG. 27A.

Figure 19A:
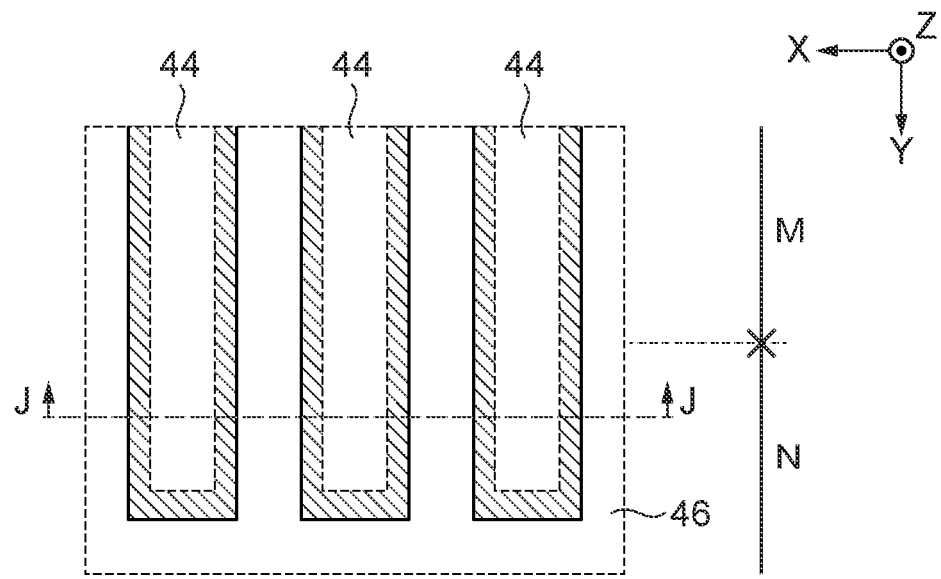
Figure 19B:
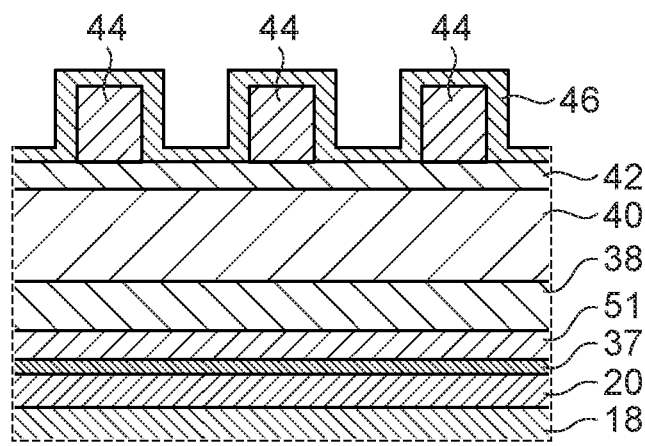

Next, as illustrated in FIGS. 19A and 19B, a seventh sacrificial film 46 is formed so as to cover the sixth sacrificial film 42 and the resist 44. The seventh sacrificial film 46 contains an insulating film such as silicon dioxide, for example. The seventh sacrificial film 46 is formed using low-temperature CVD, for example, and is deposited under approximately room-temperature conditions, for example. The thickness of the seventh sacrificial film 46 is set to be substantially the same thickness as the width dimension of each bit-line 5 described later.

Figure 20A:
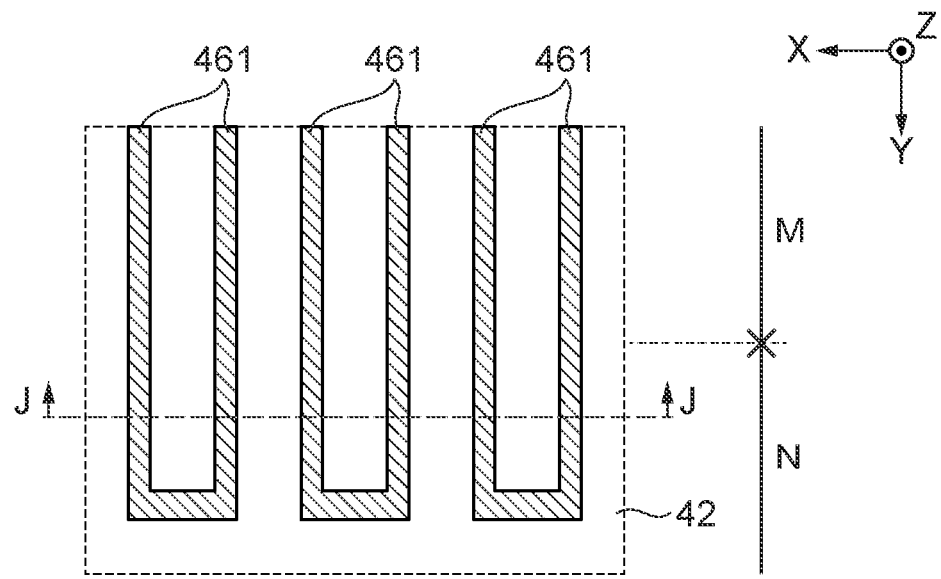
Figure 20B:
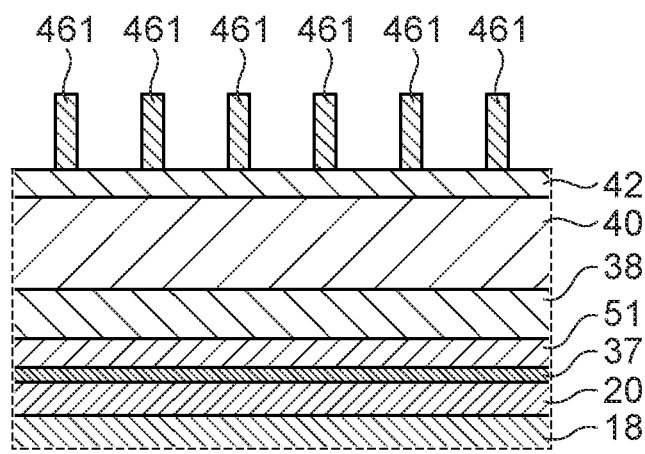

Next, as illustrated in FIGS. 20A and 20B, the seventh sacrificial film 46 is etched back by performing anisotropic dry etching on the semiconductor substrate 10 on which the seventh sacrificial film 46 is deposited, and pillars 461 are formed by leaving the seventh sacrificial film 46 on the side walls of the resist 44. The surface of the sixth sacrificial film 42 is exposed by the etchback. The pillars 461 are formed wrapping around the resist 44. Consequently, the ends of the pillars 461 are U-shaped. Thereafter, the resist 44 is removed. The X-direction dimension of the pillars 461 is prescribed by the thickness of the seventh sacrificial film 46. As illustrated in FIG. 20B, in a sectional view along the line J-J in FIG. 20A, the pillars 461 are arranged in a line-and-space layout.

Next, as illustrated in FIGS. 21A and 21B, anisotropic dry etching is performed on the sixth sacrificial film 42 and the fifth sacrificial film 40 using the pillars 461 as an etching mask. The anisotropic dry etching is performed under conditions by which the etch rate of the sixth sacrificial film 42 and the fifth sacrificial film 40 is high and the etch rate of the pillars 461 and the 11th insulating film 38 is sufficiently low. Through the anisotropic dry etching, pillars 40a obtained by the transfer of the pattern of the pillars 461 to the fifth sacrificial film 40 are formed. Thereafter, the pillars 461 and the sixth sacrificial film 42 are removed.

Figure 22A:
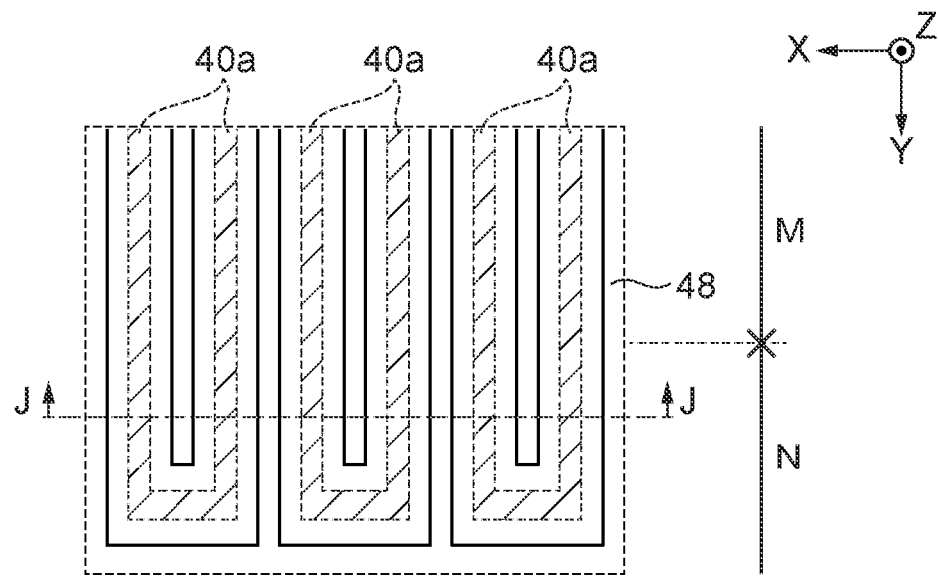
Figure 22B:
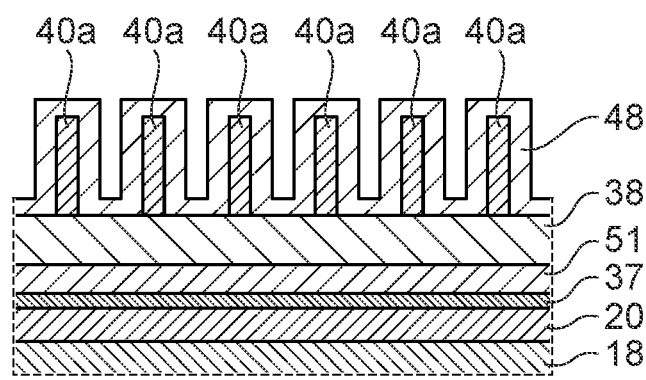

Next, as illustrated in FIGS. 22A and 22B, an eighth sacrificial film 48 is formed so as to cover the 11th insulating film 38 and the pillars 40a. The eighth sacrificial film 48 contains an insulating material. The eighth sacrificial film 48 contains silicon dioxide, for example. The eighth sacrificial film 48 is formed by CVD, for example. The thickness of the eighth sacrificial film 48 is set to be substantially the same thickness as the width dimension of each word-line 4 described later.

Figure 23A:
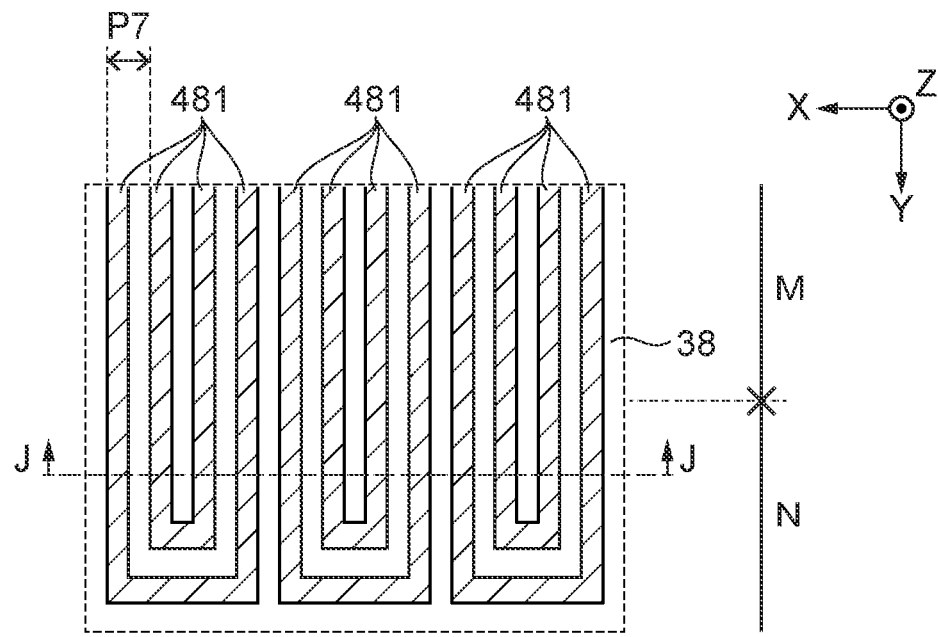
Figure 23B:
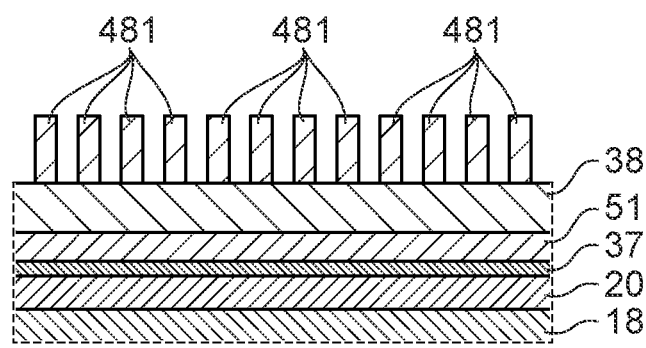

Next, as illustrated in FIGS. 23A and 23B, the eighth sacrificial film 48 is etched back by performing anisotropic dry etching on the semiconductor substrate 10 on which the eighth sacrificial film 48 is deposited, and pillars 481 are formed by leaving the eighth sacrificial film 48 on the side walls of the pillars 40a. The surface of the 11th insulating film 38 is exposed by the etchback. The pillars 481 are line-shaped. The pillars 481 are formed wrapping around the pillars 40a. Consequently, the ends of the pillars 481 are U-shaped.

Thereafter, the pillars 40a are removed by performing anisotropic dry etching under conditions by which the pillars 40a can be selectively removed. The X-direction dimension of the pillars 481 is prescribed by the thickness of the eighth sacrificial film 48. As illustrated in FIG. 23B, in a sectional view along the line J-J in FIG. 23A, the pillars 481 are arranged in a line-and-space layout with a repeating pitch P7. The repeating pitch P7 of the pillars 481 is substantially the same as the repeating pitch P5 of the bit-lines 5 illustrated in FIG. 27A.

Figure 24A:
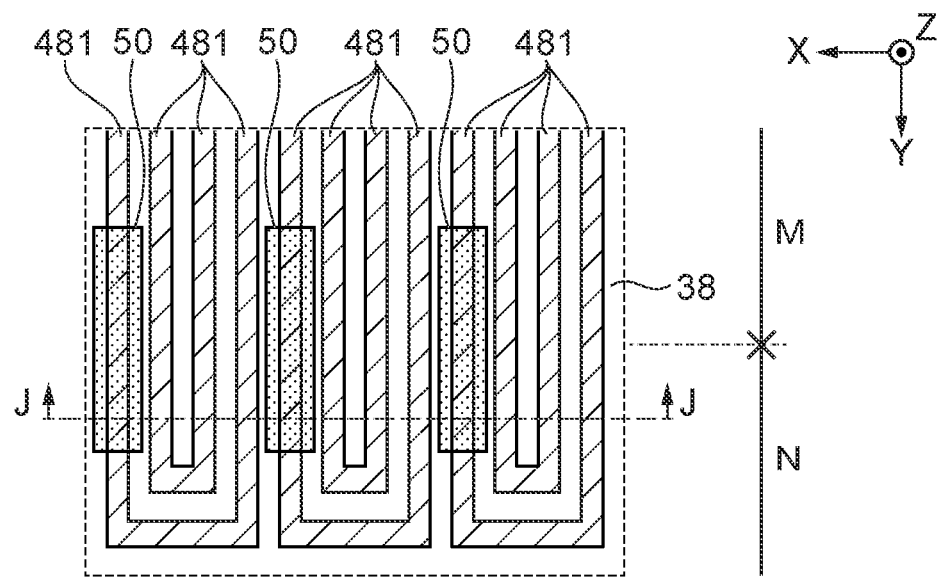
Figure 24B:
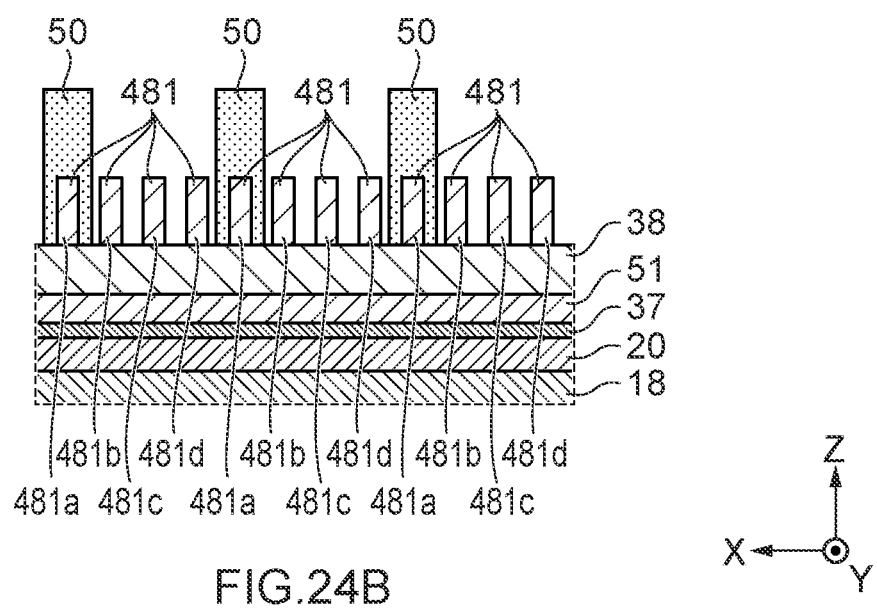

Next, as illustrated in FIGS. 24A and 24B, a resist 50 is formed so as to cover some of the plurality of pillars 481 in the peripheral region N while leaving three uncovered pillars 481 in between in the X direction. FIG. 24B is a longitudinal section illustrating the portion along the line J-J in FIG. 24A. The resist 50 is patterned by known lithography technology. The resist 50 is formed so as to cover the bit-lines 5 partially along the bit-lines 5 extending in the Y direction. As illustrated in FIG. 24B, in the portion along the line J-J in FIG. 24A, the pillars 481 are arranged in a repeating pattern of four pillars from a first pillar 481a to a fourth pillar 481d. The pattern of the four pillars 481 forms four line-shaped mask patterns extending linearly in the Y direction. The resist 50 is disposed on top of the first pillar 481a. Next, the resist 50 is cured by irradiation with ultraviolet light or by a baking process, for example.

Figure 25A:
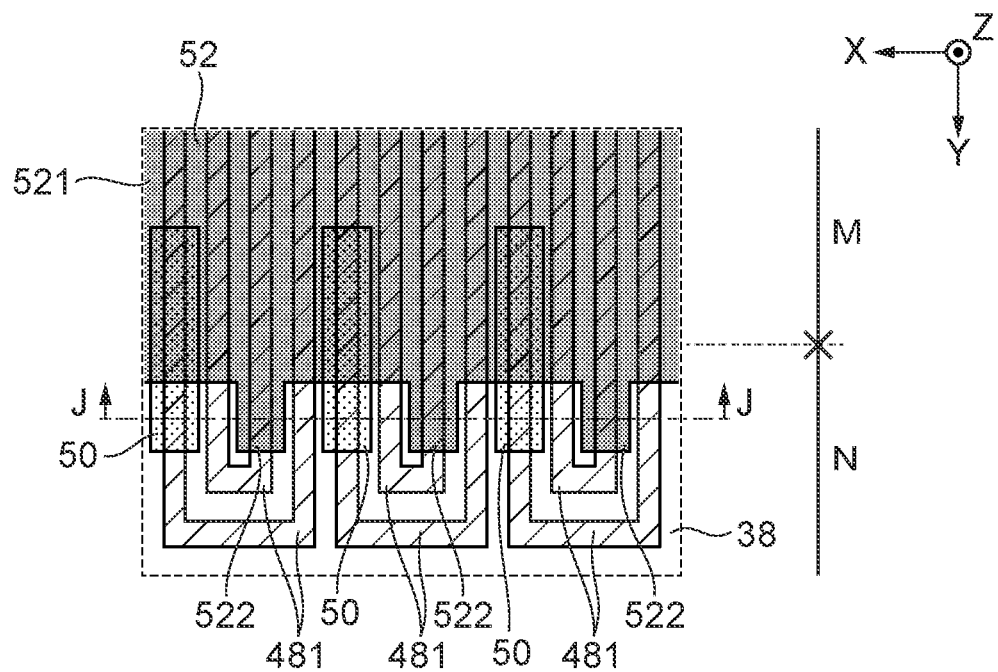
Figure 25B:
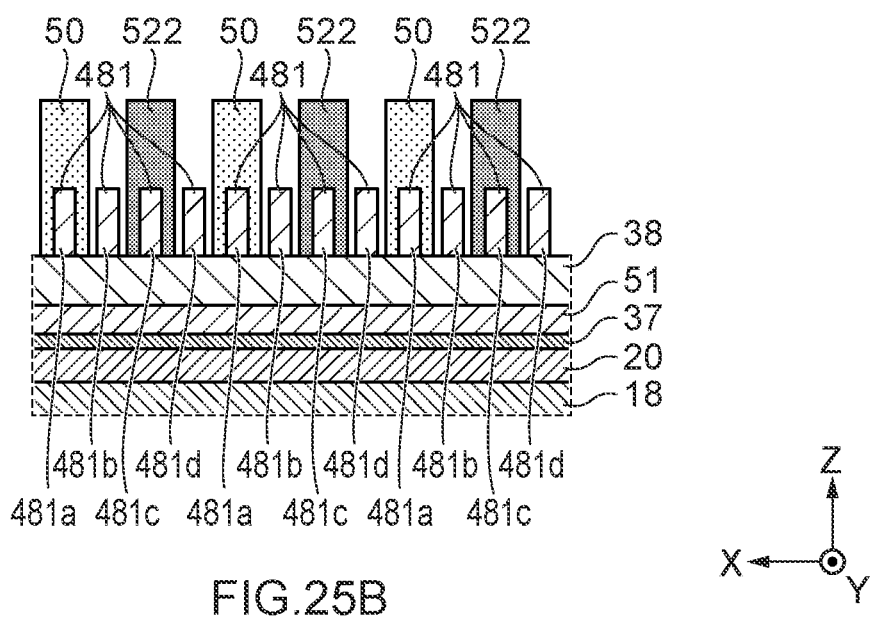

Next, as illustrated in FIGS. 25A and 25B, a resist 52 is formed in the memory cell region M and a portion of the peripheral region N. The resist 52 is patterned by known lithography technology. The resist 52 is formed partially overlapping the resist 50. Because the resist 50 has been cured, the resist 50 still remains after the formation of the resist 52.

The resist 52 has a staggered or uneven shape. The resist 52 is provided with a rectangular part 521 and projecting parts 522. The rectangular part 521 is disposed to cover the memory cell region M and a portion of the peripheral region N, such that the U-shaped parts of the pillars 481 are exposed. The projecting parts 522 are arranged so as to project into the peripheral region N from the memory cell region M. The projecting parts 522 are arranged in parallel in the X direction, centered between the adjacent resists 50. The projecting parts 522 are arranged to have at least one pillar 481 between each projecting part 522 and the adjacent resist 50.

In the case where the resist 50 is disposed on top of the first pillar 481a, the projecting parts 522 are disposed on top of the third pillar 481c. In the peripheral region N, neither the resist 50 nor the projecting parts 522 are provided on the second pillar 481b and the fourth pillar 481d. Through the above steps, in the peripheral region N, the resist 50 and the resist 52 are formed in a staggered arrangement with one pillar 481 in between, and are configured to expose the U-shaped parts of the pillars 481.

Figure 26A:
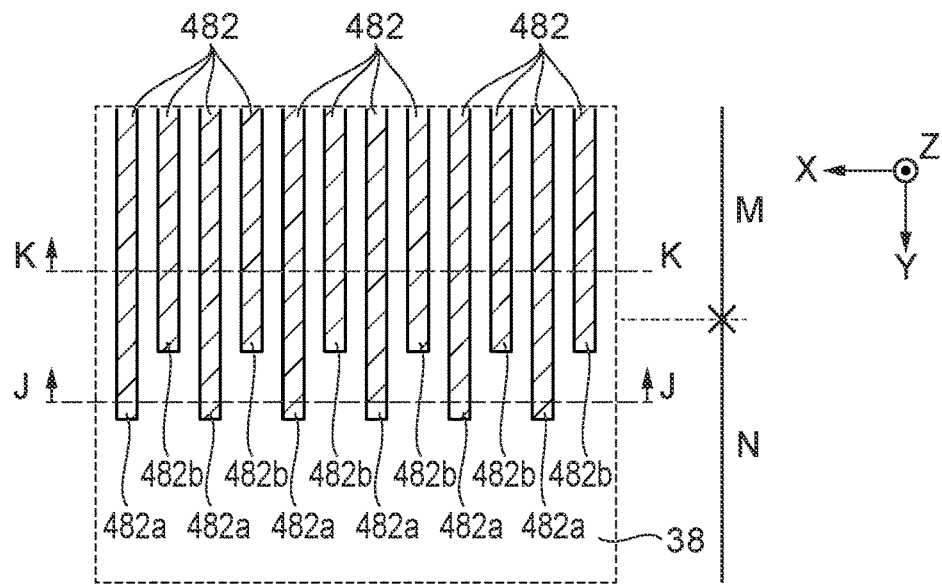
FIGS. 26A, 26B, 26C, 27A, 27B, and 27C are diagrams illustrating a method of forming the semiconductor device according to an embodiment, and illustrate an example of the schematic configuration in exemplary process stages.
Figure 26B:
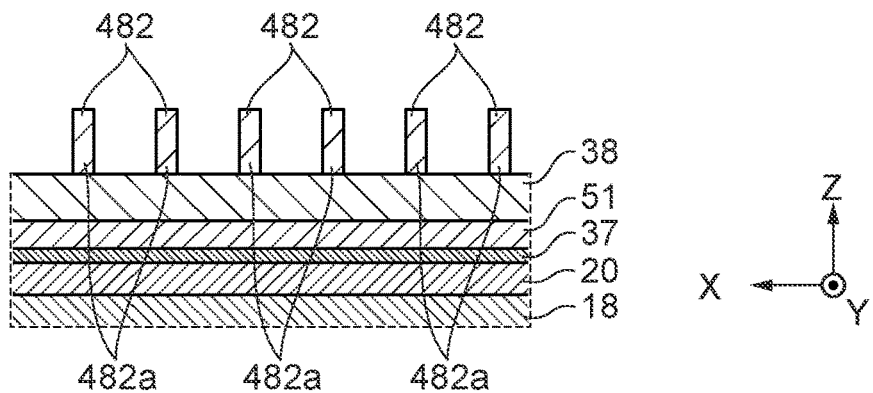
Figure 26C:
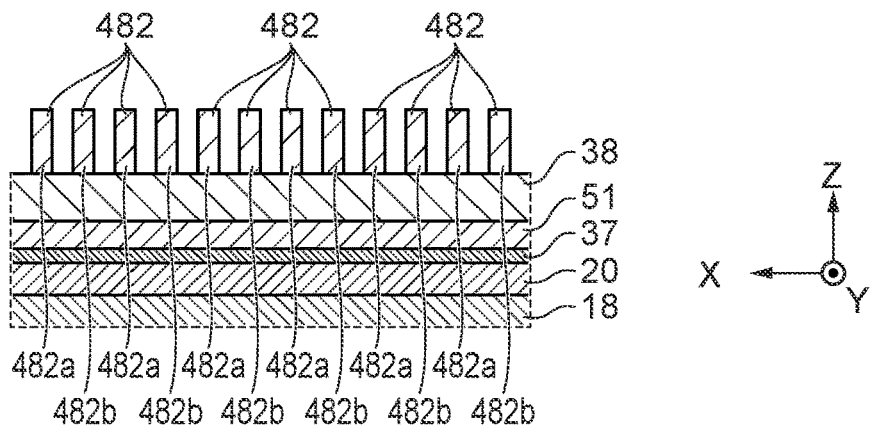

Next, as illustrated in FIGS. 26A, 26B, and 26C, anisotropic dry etching is performed on the pillars 481 using the resist 50 and the resist 52 as an etching mask. The anisotropic dry etching is performed under conditions by which the etch rate of the pillars 481 is high and the etch rate of the 11th insulating film 38 is sufficiently low. Thereafter, the resist 50 and the resist 52 are removed.

Through the anisotropic dry etching, the pillars 481 in the portions not covered by the resist 50 and the resist 52 are removed, and the remainder becomes pillars 482. Through the above steps, long pillars 482a and short pillars 482b are formed alternately in the peripheral region N.

Figure 27A:
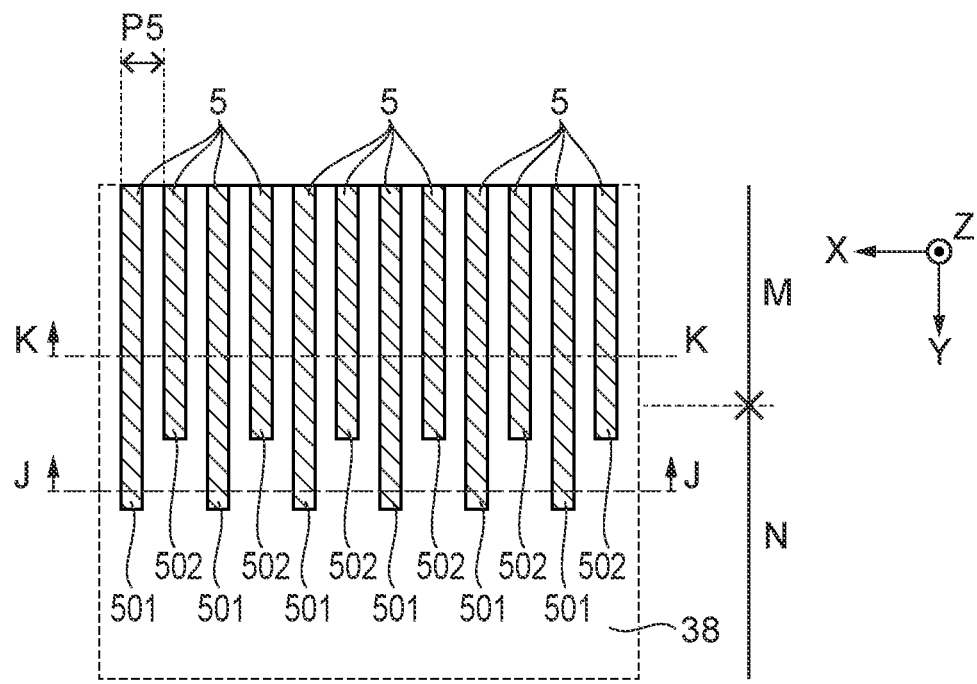
Figure 27B:
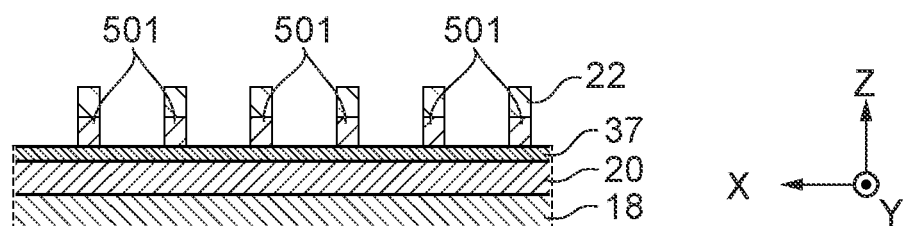
Figure 27C:
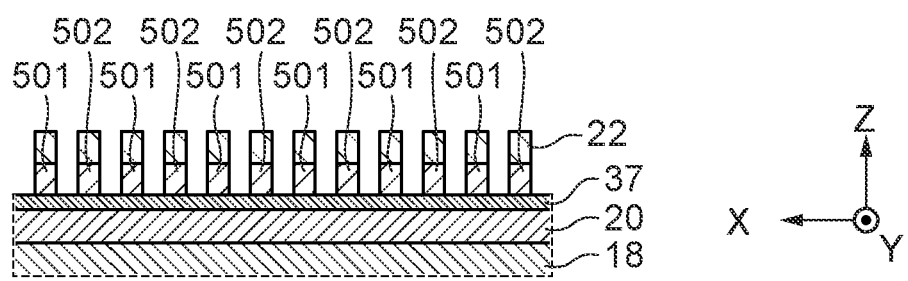

Next, as illustrated in FIGS. 27A, 27B, and 27C, anisotropic dry etching is performed on the 11th insulating film 38 and the conductive film 51 using the pillars 482 as an etching mask. The anisotropic dry etching includes dry etching performed under conditions by which the etch rate of the 11th insulating film 38 is high, followed by dry etching performed under conditions by which the etch rate of the conductive film 51 is high and the etch rate of the 10th insulating film 37 is sufficiently low.

Through the dry etching, the pattern of the pillars 482 is transferred to the 11th insulating film 38 and the conductive film 51, and the bit-lines 5 as well as the seventh insulating film 22 disposed on top of the bit-lines 5 are formed. Through the above steps, the long first bit-lines 501 and the short second bit-lines 502 are formed in the peripheral region N. The long first bit-lines 501 and the short second bit-lines 502 are arranged alternately in the peripheral region N.

The bit-lines 5 are formed by treating the resist 44 in FIGS. 18A and 18B as a prototype and performing a doubling process twice with respect to the formation of the pillars 461 in FIGS. 20A and 20B and the formation of the pillars 481 in FIGS. 23A and 23B. In other words, the bit-lines 5 are formed using quad-patterning technology. With this arrangement, the repeating pitch P5 of the bit-lines 5 illustrated in FIG. 27A is one-fourth the repeating pitch P6 of the resist 44 illustrated in FIG. 18A.

Thereafter, as illustrated in FIGS. 4A and 4B and FIGS. 6A and 6B, the eighth insulating film 24 covering the fifth insulating film 20, the bit-lines 5, and the seventh insulating film 22 is formed, and the ninth insulating film 26 covering the eighth insulating film 24 is formed. The eighth insulating film 24 contains silicon dioxide and is deposited by CVD, for example. The ninth insulating film 26 contains silicon nitride and is deposited by CVD, for example.

Next, as illustrated in FIGS. 4A and 4B, word-line contact holes open from the ninth insulating film 26 to the top face of the word-lines 4 are formed in the peripheral region N. The word-line contacts 7 are formed by embedding a conductive material such as tungsten into the word-line contact holes by CVD for example, and then perform an etchback by anisotropic dry etching.

The word-line contacts 7 illustrated in FIGS. 3A and 3B and FIGS. 4A and 4B may also be formed by a lithography step different from the lithography step for forming the contact hole of one of the adjacent word-line contacts 7. This configuration makes it possible to provide sufficient distance between the contact holes demarcated by a single lithography step, thereby avoiding phenomena such as the inability to pattern the contact holes due to being below the resolution limit of the lithography technology, and therefore the word-line contacts 7 can be formed precisely.

Next, as illustrated in FIGS. 6A and 6B, bit-line contact holes open from the ninth insulating film 26 to the top face of the bit-lines 5 are formed in the peripheral region N. The bit-line contacts 8 are formed by embedding a conductive material such as tungsten into the bit-line contact holes by CVD for example, and then perform an etchback by anisotropic dry etching.

The bit-line contacts 8 illustrated in FIGS. 5A and 5B and FIGS. 6A and 6B may also be formed using a lithography step different from the lithography step for forming the contact hole of one of the adjacent bit-line contacts 8. This configuration makes it possible to provide sufficient distance between the contact holes demarcated by a single lithography step, thereby avoiding phenomena such as the inability to pattern the contact holes due to being below the resolution limit of the lithography technology, and therefore the bit-line contacts 8 can be formed precisely.

Thereafter, as illustrated in FIG. 28, the capacitor contact 116, the capacitor 140, the insulating material 146, 147, and 152, and the interconnects 148, 149, 150, and 151 are formed. Through the above steps, the semiconductor device according to the embodiment is formed.

As described above, in the peripheral region N of the memory mat end region A1, the first word-lines 401 are longer than the second word-lines 402. In other words, the word-lines 4 have a staggered arrangement. The second word-lines 402 do not exist in the regions adjacent in the Y direction (the direction running in the extension direction of the word-lines 4) of the edge portions 4a that correspond to the overlapping portions between the first word-lines 401 and the word-line contacts 7.

By configuring the word-lines in this way, when forming the word-line contacts 7 in the edge portions 4a of the first word-lines 401, the word-line contacts 7 do not contact the adjacent second word-lines 402 at all, even if positional misalignment occurs in the lithography step. Consequently, even if the position of a word-line contact 7 is misaligned, a short circuit with an adjacent word-line 402 can be avoided or suppressed. Consequently, the manufacturing yield of the semiconductor device can be improved.

Additionally, in the peripheral region N of the memory mat end region A3, the first bit-lines 501 are longer than the second bit-lines 502. In other words, with the staggered arrangement of the bit-lines 5, the second bit-lines 502 do not exist in the regions adjacent in the X direction (the direction running in the extension direction of the bit-lines 5) of the edge portions 5a that correspond to the overlapping portions between the first bit-lines 501 and the bit-line contacts 8. Consequently, when forming the bit-line contacts 8 in the edge portions 5a of the first bit-lines 501, connections to the second bit-lines 502 adjacent to the bit-line contacts 8, or in other words a short circuit, can be avoided or suppressed, even if positional misalignment occurs in the lithography step. Consequently, the manufacturing yield of the semiconductor device can be improved.

Also, as described above, the word-lines 4 and the bit-lines 5 are formed using a doubling process twice, or in other words quad-patterning technology. This configuration eliminates the need to using patterning at or near the resolution limit of the lithography technology, and therefore the word-lines 4 and the bit-lines 5 can be formed precisely. Consequently, the manufacturing yield of the semiconductor device can be improved.

As above, DRAM is described as an example of the semiconductor device according to the embodiment, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method comprising:
forming a repetition of four line-shaped mask patterns extending across a memory cell region and a peripheral region provided over a substrate;
forming a first resist pattern arranged periodically on the line-shaped mask patterns so as to sandwich three of the line-shaped mask patterns in between;
forming a second resist pattern arranged periodically on the line-shaped mask patterns so as to sandwich one of the line-shaped mask patterns between the first resist pattern and the second resist pattern; and
transferring a staggered pattern to a member arranged under the line-shaped mask patterns, the staggered pattern being formed by the line-shaped mask patterns, the first resist pattern, and the second resist pattern using the line-shaped mask patterns, the first resist pattern, and the second resist pattern as masks.

2. The method of claim 1, wherein the first resist pattern is cured before forming the second resist pattern.

3. The method of claim 1,
wherein the line-shaped mask patterns are openings,
wherein, in the transferring process, the line-shaped mask patterns are transferred to the member arranged under the line-shaped mask patterns as trenches, and
wherein the method further comprises forming wiring by burying a conductive material in the trenches.

4. The method of claim 3, further comprising:
adjusting a depth of the trenches by controlling the duration of anisotropic dry etching of the substrate.

5. The method of claim 1,
wherein the line-shaped mask patterns are line patterns, and
wherein, in the transferring process, a plurality of wirings are formed by transferring the line patterns to the member arranged under the line-shaped mask patterns.

6. The method of claim 1, wherein the second resist pattern is formed while partially overlapping the first resist pattern.

7. A method comprising:
forming a first film and a first resist on a substrate;
forming first pillars on side walls of the first resist, wherein the first pillars wrap around the first resist;
etching the first resist;
forming second pillars on side walls of the first pillars, wherein the second pillars wrap around the first pillars;
selectively removing the first pillars after the second pillars are formed;
selectively removing the second pillars to form third pillars, wherein the third pillars have an inverse pattern of the second pillars, and wherein respective regions where the second pillars are removed become gaps between the third pillars, wherein the gaps are arranged in a repeating pattern comprising a first gap, a second gap, a third gap, and a fourth gap;
forming a second resist disposed in a portion on top of the first gap;
forming a third resist partially overlapping the second resist, wherein the third resist has a staggered shape;
etching the substrate using the first film, the second resist, and the third resist as an etching mask to form a first trench and a second trench, wherein the first trench and the second trench are formed alternately in the substrate; and
embedding a conductive material in a lower part of the first trench to form a first word line and in a lower part of the second trench to form a second word line.

8. The method of claim 7, wherein the third resist comprises a rectangular part and a plurality of projecting parts, wherein the rectangular part is configured to cover at least portions of the third pillars, and wherein the plurality of projecting parts is arranged in parallel and centered between adjacent second resists.

9. The method of claim 8, wherein the plurality of projecting parts are disposed in the third gap.

10. The method of claim 7, wherein the second resist is cured prior to the formation of the third resist.

11. The method of claim 7, further comprising:
covering an upper part of the first trench, an upper part of the second trench, and a top face of the substrate with an insulating material.

12. The method of claim 7, wherein ends of the third pillars are U-shaped.

13. The method of claim 7, wherein the first film contains $SiO_2$ and is formed by chemical vapor deposition (CVD), wherein a thickness of the first film is approximately triple a width of the first word line.

14. The method of claim 13, further comprising:
forming a second film to cover the first film and the first resist, wherein the second film contains SiN, wherein the second film is formed using low-temperature CVD, and wherein a thickness of the second film is substantially equal to a width of the first word line; and
etching the substrate on which the second film is deposited, wherein the first pillars are formed by leaving the second film on the side walls of the first resist.

15. The method of claim 7, further comprising:
adjusting depths of the first trench and the second trench by controlling a duration of the etching of the substrate.

16. A method comprising:
forming a plurality of wirings by burying a first conductive material formed in trenches across a first peripheral region to a second peripheral region, wherein a memory cell region is disposed between the first and second peripheral regions, wherein in the first peripheral region, first wirings of the plurality of wirings are longer than second wirings of the plurality of wirings, and wherein in the second peripheral region, the second wirings are longer than the first wirings;
forming contacts in edge portions of the first wirings in the first peripheral region by embedding a second conductive material into respective contact holes by CVD; and
forming contacts in edge portions of the second wirings in the second peripheral region by embedding the second conductive material into respective contact holes by CVD.

17. The method of claim 16, wherein the contacts in the edge portions of the first wirings are provided so as to reach from a top face of a top insulating film deposited over the wiring to a top face of the wiring in the first peripheral region.

18. The method of claim 16, wherein the contacts in the edge portions of the second wirings are provided so as to reach from a top face of a top insulating film deposited over the wiring to a top face of the wiring in the second peripheral region.

19. The method of claim 16, wherein the first wirings and the second wirings are alternately arranged.

20. The method of claim 16, wherein the top insulating film contains SiN and is deposited by CVD.

* * * * *